United States Patent [19]
Suzuki et al.

[11] Patent Number: 5,559,998
[45] Date of Patent: Sep. 24, 1996

[54] CLOCK SYNCHRONOUS SERIAL INFORMATION RECEIVING APPARATUS RECEIVING RELIABLE INFORMATION EVEN WHEN NOISE IS PRESENT

[75] Inventors: Katsunori Suzuki; Masayuki Hata, both of Itami, Japan

[73] Assignee: Mitsubishi Denki Kabushiki Kaisha, Tokyo, Japan

[21] Appl. No.: 268,746

[22] Filed: Jun. 30, 1994

[30] Foreign Application Priority Data

Jul. 2, 1993 [JP] Japan .................................. 5-164621

[51] Int. Cl.$^6$ ...................................................... G06F 1/14
[52] U.S. Cl. ........................ 395/550; 371/37.9; 364/271; 364/271.1; 364/DIG. 1
[58] Field of Search .............................. 395/182.04, 550, 395/878, 881, 891; 364/271, 271.1; 371/30, 37.9, 40.1, 42, 36

[56] References Cited

U.S. PATENT DOCUMENTS

| | | | |
|---|---|---|---|
| 3,643,027 | 2/1972 | Goldberg | 178/88 |
| 4,132,975 | 1/1979 | Koike | 340/146.1 |
| 4,227,175 | 10/1980 | Newman | 340/146.2 |

OTHER PUBLICATIONS

B. P. Lathi, "Modern Digital And Analog Communication Systems", 1989, pp. 192–194 and 196–206.
Joseph D. Greenfield, "Practical Digital Design Using Ics", 1983, pp. 575–578.
Mitsubishi One–Chip Microcomputer M377202S1FP, M37720S1AFP, User's Manual 2–106– 2–147, Jul. 1991.

*Primary Examiner*—Thomas M. Heckler
*Assistant Examiner*—Dennis M. Butler
*Attorney, Agent, or Firm*—Lowe, Price, LeBlanc & Becker

[57] ABSTRACT

A clock synchronous information receiving apparatus comprising a control signal circuit 6 for receiving a communication clock 3 and outputting a control signal 8, a control signal generating circuit 10 for outputting three control signals 121, 122, 123 differing in the timing of changing from high level to low level in synchronism with the communication clock 3, a communication data compensation circuit 11 for storing communication data 5 at the falling timing of the three control signals 121, 122, 123 of the control signal generating circuit 10, and determining the value of the communication data 5 from the stored values and sending out compensated communication data 50, and a serial/parallel converting circuit 7 for converting the compensated communication data 50 outputted serially from the communication data compensation circuit 11 into parallel and outputting into an 8-bit bus 9, thereby capable of receiving data correctly when noise is generated on the communication data.

8 Claims, 23 Drawing Sheets

FIG. 14

| a | b | c | d | e | f | 50 |
|---|---|---|---|---|---|----|
| L | L | L | H | H | H | L |
| L | L | H | H | H | H | L |
| L | H | L | H | H | H | L |
| L | H | H | H | H | L | H |
| H | L | L | H | H | H | L |
| H | L | H | L | H | H | H |
| H | H | L | H | L | H | H |
| H | H | H | L | L | L | H |

FIG. 19

| a | b | c | d | e | f |
|---|---|---|---|---|---|
| L | L | H | H | H | L |
| L | H | H | H | L | H |
| H | L | H | L | H | H |
| H | H | L | H | H | L |

CLOCK SYNCHRONOUS SERIAL INFORMATION RECEIVING APPARATUS RECEIVING RELIABLE INFORMATION EVEN WHEN NOISE IS PRESENT

BACKGROUND OF THE INVENTION

1. Field of the Invention

The present invention relates to a clock synchronous information transmit apparatus (hereinafter to be called a transmit unit of a clocked serial I/O), and a clock synchronous information receiving apparatus (hereinafter to be called a receiving unit of the clocked serial I/O, and clock synchronous information transmit and receiving apparatus is represented as the clocked serial I/O), and more particularly to a receiving unit of the clocked serial I/O in the case, where noises occur in a communication data for information exchange.

2. Description of the Related Art

In a microcomputer, when communicating information with peripherals and other microcomputers, there are a method of transmitting and receiving data in parallel and a method of transmitting and receiving data in series. In the parallel and serial transmissions and receptions, more data can be transferred per unit time in the case of using the parallel transmitting and receiving. However, when considering a communication cost, more wirings are required in the parallel transmitting and receiving, thus the cost increases. So there is a field accepting the serial transmitting and receiving in which less wirings is required even though a transfer rate is low.

However, also in the serial transmitting and receiving, there are the clocked serial I/O which uses a communication clock and transmits and receives data in synchronism with the communication clock, and an asynchronous serial information transmitting and receiving which transmits and receives data without using the communication clock. Also in this case, the transfer rate and the number of wirings are related to each other; the higher transfer rate is the clocked serial I/O and the less wirings is the asynchronous serial information transmitting and receiving. And hence, in the field where the wirings are few and the transfer rate is high, the clocked serial I/O is frequently used.

Next, the operation of the above-mentioned clocked serial I/O is briefly described.

FIG. 1 is a schematic view showing connection between the transmit unit and the receiving unit of the clocked serial I/O.

In FIG. 1, numeral 1 designates the transmit unit of the clocked serial I/O, numeral 2 designates the receiving unit of the clocked serial I/O, numeral 3 designates the communication clock outputted from the receiving unit 2 of the clocked serial I/O and inputted to the transmit unit 1 of the clocked serial I/O, numeral 4 designates a communication enable outputted from the transmit unit 1 of the clocked serial I/O and inputted to the receiving unit 2 of the clocked serial I/O, and numeral 5 designates communication data outputted from the transmit unit 1 of the clocked serial I/O and inputted to the receiving unit 2 of the clocked serial I/O.

The operation is described with reference to a timing chart shown in FIG. 2. In the timing chart shown in FIG. 2, a signal flow is shown as a time lapse from left to right.

When the transmit unit 1 of the clocked serial I/O transmits data "b00110110" (b indicates that following numerals are binary), at first, the communication enable 4 is changed to a low level from a high level. The receiving unit 2 of the clocked serial I/O starts the communication clock 3 when recognizing that the communication enable 4 is at the low level. Responding to the low level of the communication clock 3, the transmit unit 1 of the clocked serial I/O brings the communication enable 4 to the high level, and outputs the low level as the communication data 5. The receiving unit 2 of the clocked serial I/O brings the communication clock 3 to the high level, and receives information of the communication data 5 at the timing thereof. Since it is at the low level in this case, "0" is recognized.

Next, in order to have the next data being transferred, the receiving unit 2 of the clocked serial I/O brings the communication clock 3 to the low level. Since the transmit unit 1 of the clocked serial I/O transmits the next data "0" responding to the low level of the communication clock 3, the communication data 5 is kept at the low level. Next, the receiving unit 2 of the clocked serial I/O brings the communication clock 3 to the high level, and receives information of the communication data 5 at the timing thereof. Since it is at the low level in this case, "0" is recognized.

Next, the receiving unit 2 of the clocked serial I/O brings the communication clock 3 to the low level to have the third data being transferred. Responding to the low level of the communication clock 3, the transmit unit 1 of the clocked serial I/O brings the communication data 5 to the high level to transmit the next data "1". The receiving unit 2 of the clocked serial I/O brings the communication clock 3 to the high level, and receives information of the communication data 5 at the timing thereof. Since it is at the high level in this case, "1" is recognized.

There is assumed to be a noise generated on the communication data, 5 when the receiving unit 2 of the clocked serial I/O receives the fourth data, it should be recognized to be "1", but it is misjudged that "0" has been received.

Afterwards, when the receiving unit 2 of the clocked serial I/O receives the fifth to eighth data, the data "b00100110" is transferred from the transmit unit 1 of the clocked serial I/O to the receiving unit 2 of the clocked serial I/O.

A simple signal flow is explained below by referring to the block diagram showing a configuration of the receiving unit 2 of the clocked serial I/O in FIG. 3.

In FIG. 3, reference numeral 6 denotes a control signal circuit for receiving a communication clock 3 and outputting a control signal 8, and 7 denotes a serial/parallel (S/P) converting circuit for receiving the control signal 8, converting the information sent seriously from the communication data 5 into parallel data, and outputting the parallel data to an 8-bit bus 9.

The control signal circuit 6 outputs the control signal 8 in order to take in the transferred communication data 5 into the serial/parallel converting circuit 7 at the rising timing of the communication clock. For example, when such data is transferred eight times, the receiving unit 2 of the clocked serial I/O outputs "b00100110" instead of the data of "b00110110" to the 8-bit bus 9 due to noise.

In such conventional apparatus, the data received by the receiving unit 2 of the clocked serial I/O is "b00100110" because of noise, and correct data cannot be transmitted and received. Thus, in the conventional apparatus, when noise is generated on the communication data 5, wrong data was exchanged.

SUMMARY OF THE INVENTION

The invention was devised to solve the above problems, and it is an object thereof to provide a clock synchronous serial information receiving apparatus capable of receiving data normally when noise is generated on the communication data.

The clock synchronous information receiving apparatus of a first embodiment of the invention comprises control signal generating means for generating three kinds of control signals differing in falling timing although rising synchronously with the reference clock of transmission of information signal, and information compensating means for storing the information signals in three storing means at the falling timing of these control signals and deciding the value of the information by majority.

In such a clock synchronous serial information receiving apparatus of the first embodiment of the invention, when noise is generated in the received information signal, the information compensated to a correct value by the information compensating means can be received.

The clock synchronous serial information receiving apparatus of a second embodiment of the invention comprises control signal generating means for generating two kinds of control signals differing in falling timing although rising synchronously with the reference clock of transmission of information signal, and information judging means for storing the information signals in two storing means at the falling timing of these control signals and judging their agreement/disagreement.

In such a clock synchronous serial information receiving apparatus of the second embodiment of the invention, when noise is generated on the received information signal and it is not received correctly, it is detected by the information judging means.

The clock synchronous serial information receiving apparatus of a third embodiment of the invention comprises delay means for delaying the information signal entering the information compensating means, in addition to the configuration in first embodiment.

In such a clock synchronous serial information receiving apparatus in the third embodiment of the invention, the information compensated to a correct value by the information compensating means can be received.

The clock synchronous serial information receiving apparatus of a fourth embodiment of the invention comprises delay means for delaying the information signal entering the information compensating means, in addition to the configuration in second embodiment.

In such a clock synchronous serial information receiving apparatus of a fourth embodiment of the invention, the information compensated to a correct value by the information compensating means can be received.

The above and further objects and features of the invention will more fully be apparent from the following detailed description with accompanying drawings.

BRIEF DESCRIPTION OF THE DRAWINGS

FIG. 14 is a truth table of the compensation data operation circuit shown in FIG. 13, FIG. 19 is a truth table of the judging circuit shown in FIG. 18.

DESCRIPTION OF THE PREFERRED EMBODIMENTS

Figure 1:
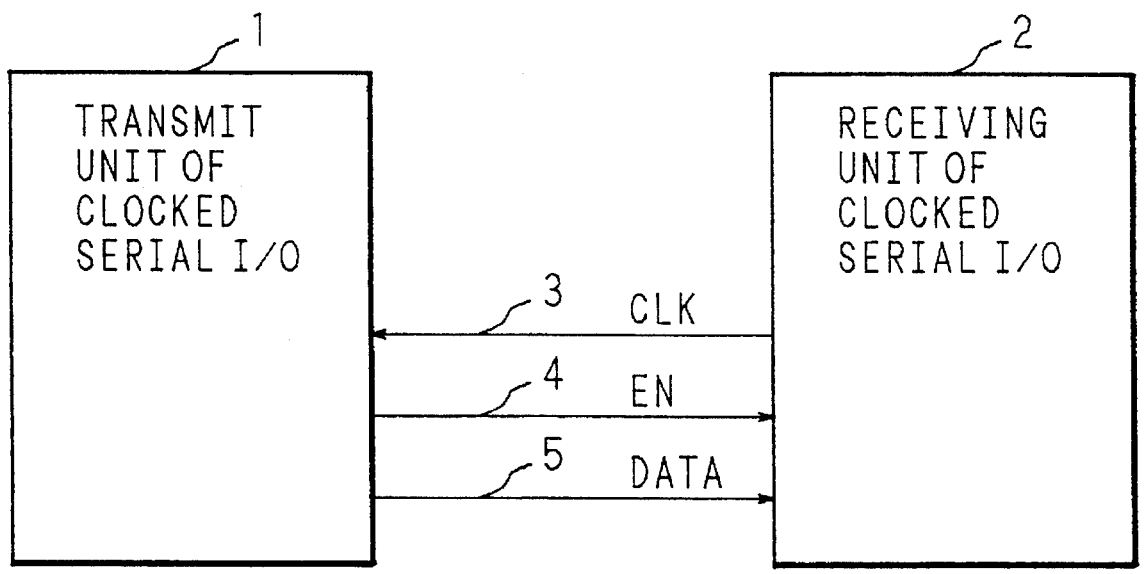
FIG. 1 is a block diagram showing a general state of connecting a transmit unit and a receiving unit of a clocked serial I/O.
Figure 2:
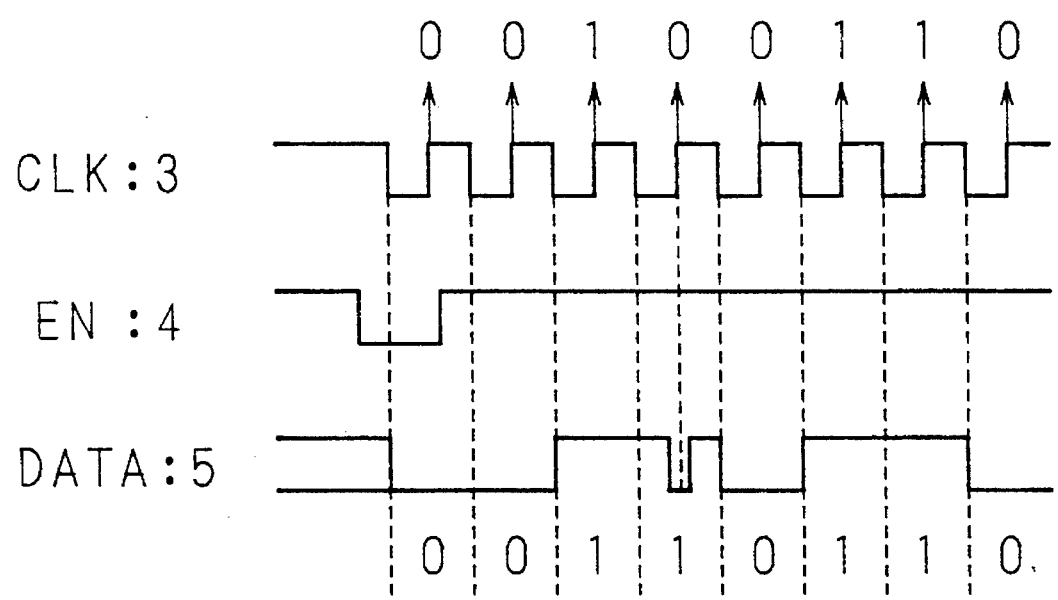
FIG. 2 is a timing chart of transmission and reception exchanged between the transmit unit and receiving unit of a clocked serial I/O shown in FIG. 1.
Figure 3:
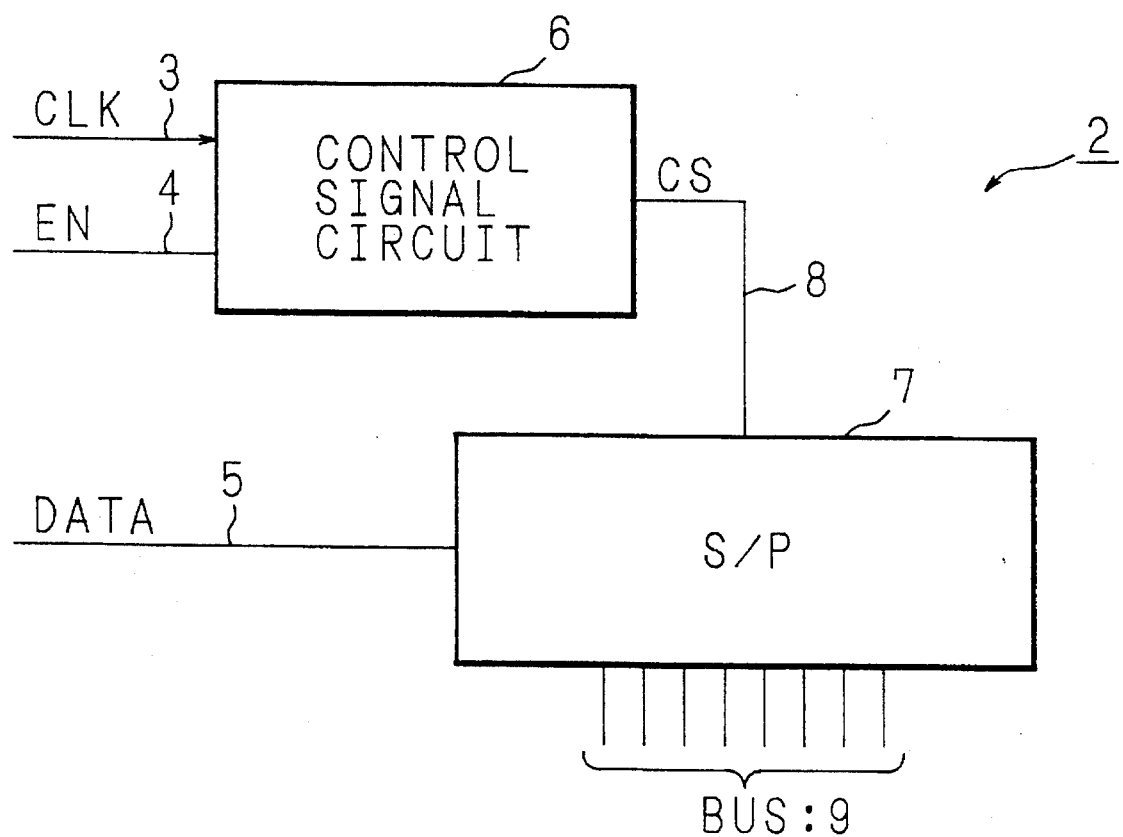
FIG. 3 is a block diagram showing a configuration example of a receiving unit of a conventional serial clocked I/O.

Referring now to the drawings, embodiments of the invention are described in detail below.

[First Embodiment]

Figure 4:
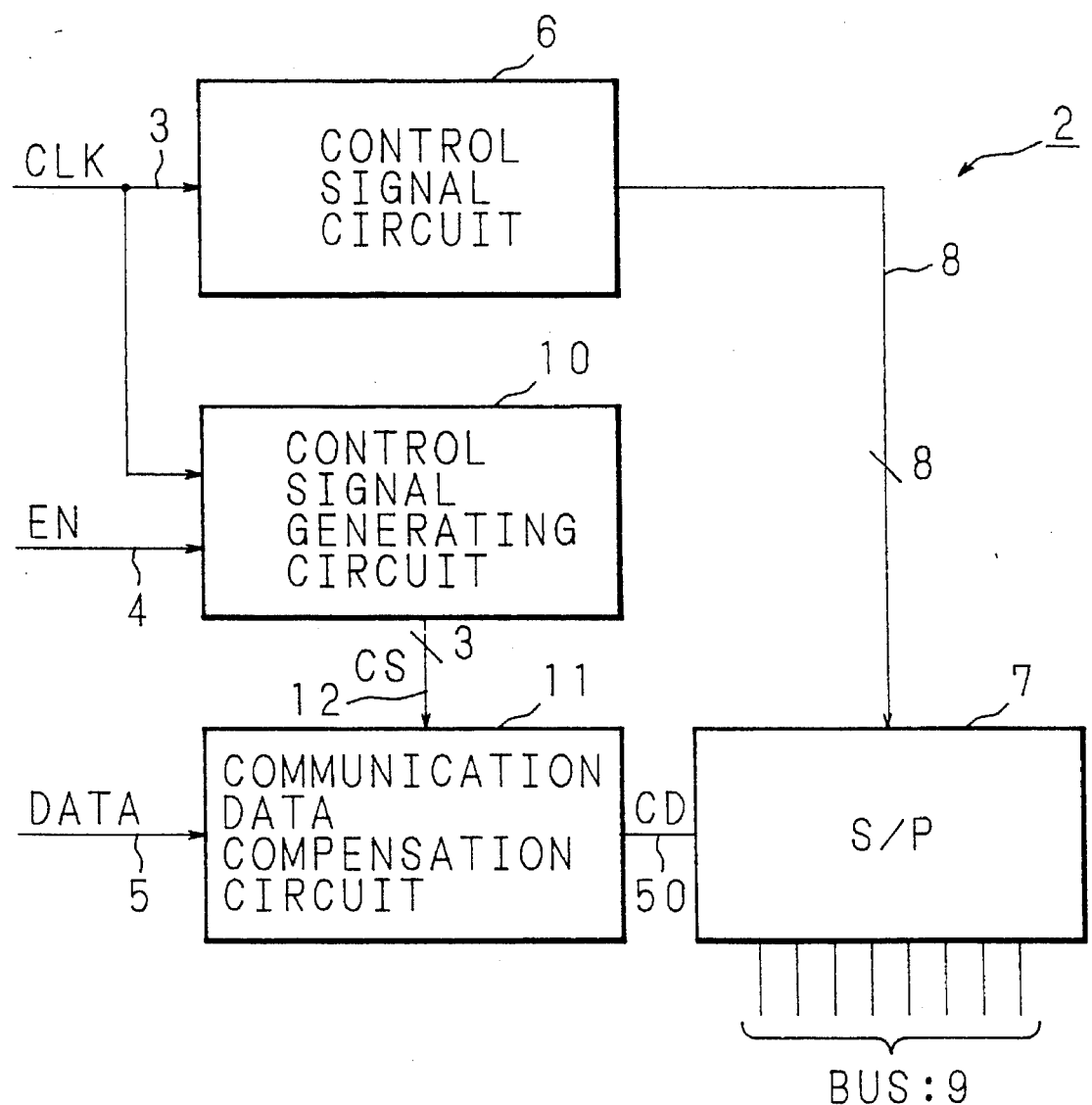
FIG. 4 is a block diagram showing a configuration example of a first embodiment of a receiving unit of a serial clocked I/O of the invention.

At first, a first embodiment of a clock synchronous serial information receiving apparatus (hereinafter to be called a receiving unit of the clocked serial I/O) of the invention is described while referring to a block diagram of FIG. 4 showing a configuration example thereof.

The entire configuration of the transmit and receiving apparatus is same as in the prior art shown in FIG. 1, and therefore in the following explanation, only the receiving unit of the clocked serial I/O of the invention is described.

In FIG. 4, reference numeral 3 denotes a communication clock connected to the receiving unit 2 of the clocked serial I/O (indicated as communication clock 31 in case of an inverted signal of communication clock 3), and it is given to a control signal circuit 6 and a control signal generating circuit 10.

Reference numeral 6 denotes communication data connected to the receiving unit 2 of the clocked serial I/O, and it is given to a communication data compensation circuit 11.

The control signal circuit 6 receives the communication clock 3, and outputs a control signal 8. Similarly, the control signal generating circuit 10 also generates three control signals 12 (121, 122, 123) which rise at the falling timing of the communication clock 3, and fall at slightly deviated timing successively.

The communication data compensation circuit 11 stores the communication data 5, at the timing of changing from high level to low level of three control signals 12 generated by the control signal generating circuit 10, and from these results, the information of communication data 5 is determined and outputted as compensated communication data 50.

Reference numeral 7 converts the compensated communication data 50 which is the serial data outputted from the communication data compensation circuit 11 into parallel data according to the control signal 8 outputted from the control signal circuit 6, and outputs it to an 8-bit bus 9.

In thus configured first embodiment of the receiving unit 2 of the clocked serial I/O of the invention, the operation is described below.

For example, when data "b00110110" is received is described. In this case, since the control signal generating circuit 10 generates three kinds of control signals 12 which simultaneously rise at the falling timing of the communication clock 3 and fall respectively at different timing from each other, first data "0" sent forth as communication data 5 is stored by the communication data compensation circuit 11 as "0" at the first falling timing of the control signal 12, as "0" at the second falling timing, and as "0" at the third falling timing respectively. Thus, all three stored results by the communication data compensation circuit 11 are "0", and the communication data compensation circuit 11 outputs "0" as the compensated communication data 50.

In the following explanations, the three stored contents by the communication data compensation circuit 11 are expressed in the sequence of the first timing, second timing and third timing by enclosing with brackets < >. For example, when the first data is received, it is expressed as <000>. When compensating, it is expressed as <@000>, and its result is shown as "0"=<@000>.

The serial/parallel converting circuit 7 takes in and temporarily stores the compensated communication data 50 outputted from the communication data compensation circuit 11 in accordance with the control signal 8 outputted from the control signal circuit 6.

Thus, the second data and third data "0" and "1" are sequentially taken in. Then the fourth data "1" is taken in, and a noise is assumed to be mixed in the communication data 5 at the sampling timing. In this case, since the noise timing is the rising timing of the communication clock 3, the communication data compensation circuit 11 stores <011>. However, when the communication data compensation circuit 11 performs compensation, it follows that "1"=<@011>, and hence "1" is outputted as the compensated communication data 50.

Consequently, the serial/parallel converting circuit 7 takes in "1" outputted as compensated communication data 50 by the communication data compensation circuit 11 according to the control signal 8. The remaining data are also taken into the serial/parallel converting circuit 7, and finally "b00110110" is outputted from the serial/parallel converting circuit 7 into the 8-bit bus 9.

In this way, the receiving unit 2 of the clocked serial I/O of the first embodiment receives connect data, when wrong data is received as noise is generated in the communication data 5, by compensating it.

Each block shown in FIG. 4 is described in detail below.

Figure 5:
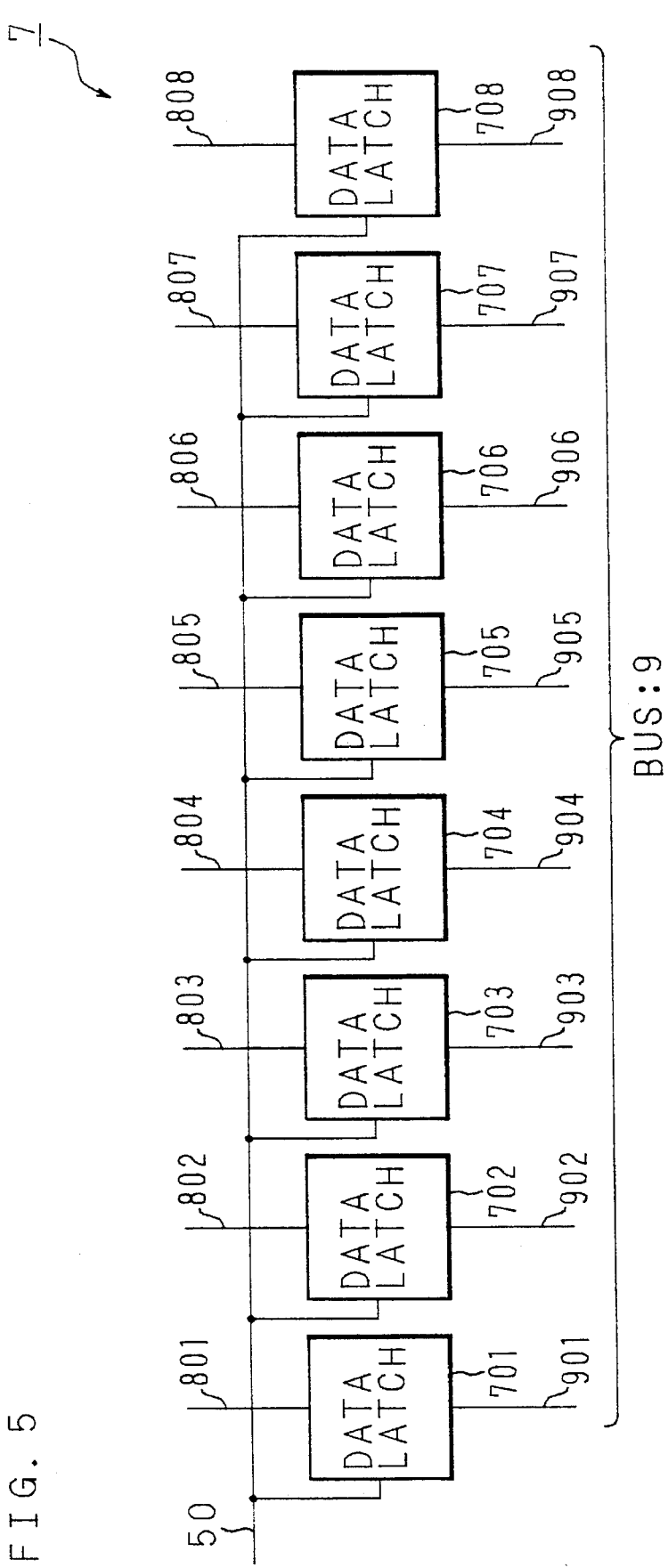
FIG. 5 is a block diagram showing a configuration example of a serial/parallel converting circuit of the first embodiment of the invention.

FIG. 5 is a block diagram showing a configuration example of the serial/parallel converting circuit 7.

In FIG. 5, reference numerals 701 to 708 represent eight data latches for storing the compensated communication data 50. Reference numerals 801 to 808 individually express eight signals outputted from the control signal circuit 6, and are given to the data latches 701 to 708 as the control signals for storing the compensated communication data 50 respectively. Reference numerals 901 to 908 represent the outputs of the data latches 701 to 708, or expressing each one of the 8-bit bus 9.

Figure 6:
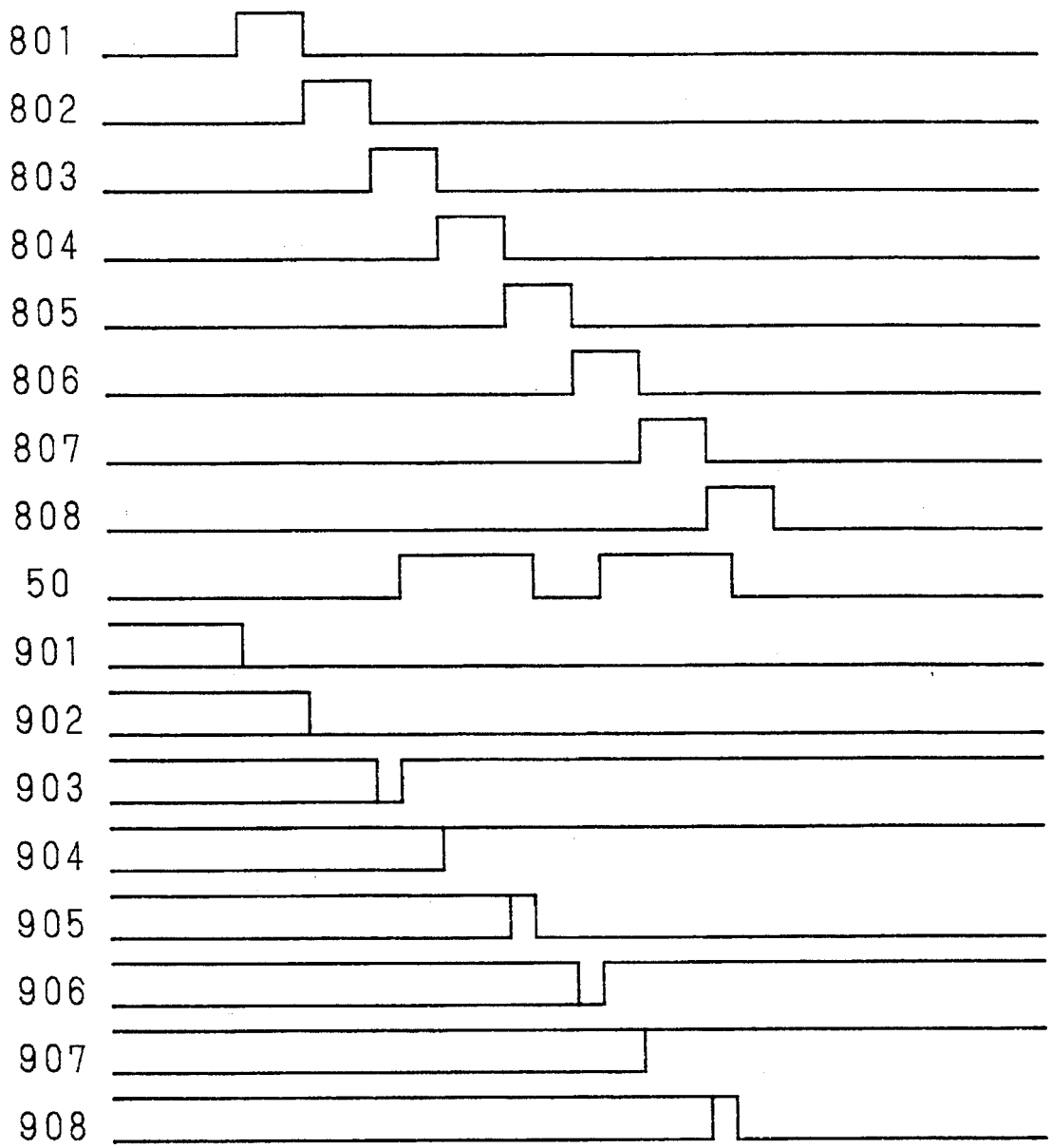
FIG. 6 is a timing chart showing an operation example of the serial/parallel converting circuit shown in FIG. 5.

The operation of the serial/parallel converting circuit 7 shown in FIG. 5 is explained below by referring to the timing chart in FIG. 6.

At the beginning, all data latches 901 to 908 are in undefined state. It is the state of the first and second cycles shown at the left end in FIG. 6.

Next, as the control signal 801 becomes high level, the data latch 701 stores the information of the compensated communication data 50, and the result is sent out to the first bit 901 of the 8-bit data bus 9. Therefore, the first bit 901 of the data bus 9 becomes low level. This state is shown in the third cycle in FIG. 6.

Thereafter, as the control signals 802 to 808 become high level sequentially, the data latches 702 to 708 store tile information of the compensated communication data 50 sequentially. As a result, the second bit 902 of the 8-bit data bus 9 becomes "0", the third bit 903 is "1", the fourth bit 904 is "1", the fifth bit 905 is "0", the sixth bit 906 is "1", the seventh bit 907 is "1", and the eighth bit 908 is "0".

In this way, as the serial/parallel converting circuit 7 operates, the data received by the receiving unit 2 of the clocked serial I/O is sent out to the data bus 9.

A configuration example of the data latches 701 to 708 is explained by reference to the logic circuit diagram in FIG. 7.

Figure 7:
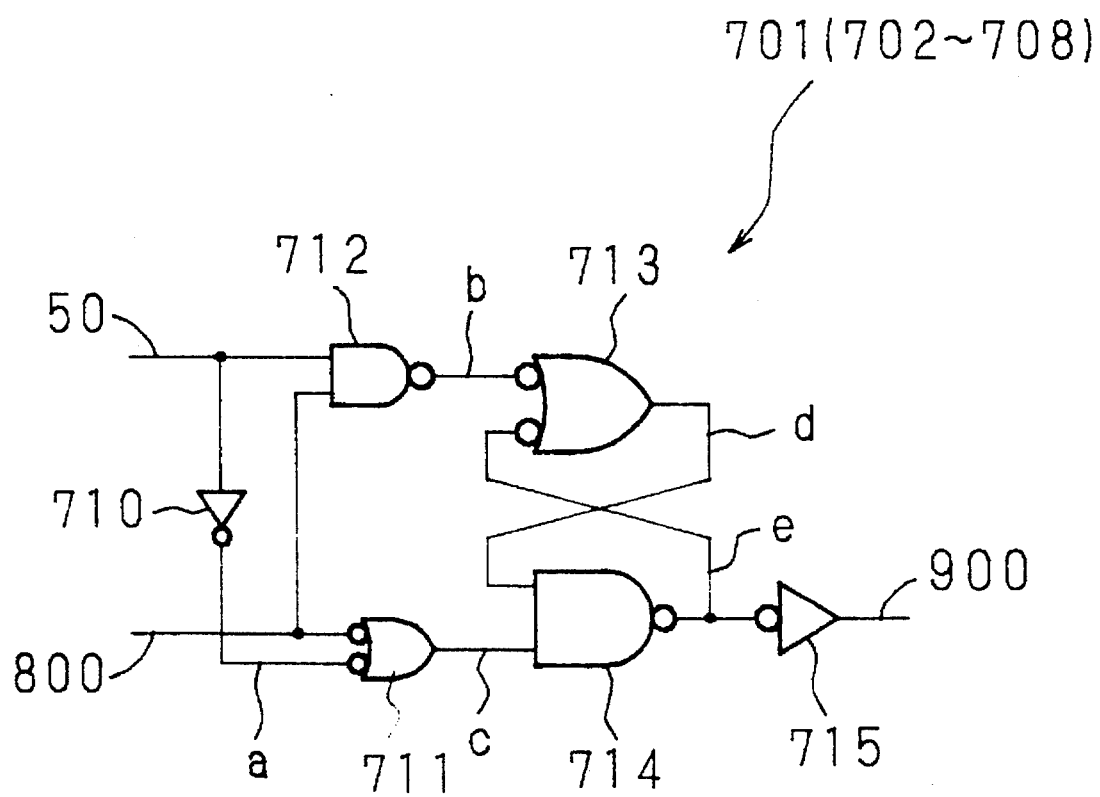
FIG. 7 is a logic circuit diagram showing a configuration example of a data latch of the first embodiment of the invention.

In FIG. 7, reference numeral 800 shows a control signal outputted from the control signal circuit 6, and it is fed into one input terminal of a NAND element 711. Reference numeral 710 denotes an inverter element for inverting the compensated communication data 50, and its output ("a" in the explanation hereinafter) is fed into the other input terminal of the NAND element 711.

The NAND element 711 receives the control signal 800 and the output a of the inverter element 710, and outputs a signal of NAND logic of the both as an output signal c.

Reference numeral 712 represents a NAND element, which receives the compensated communication data 50 and control signal 800, and outputs a signal of NAND logic of the both as an output signal b.

Reference numeral 713 is also a NAND element, which receives the output b of the NAND element 712 and an output e of a NAND element 714, and outputs a signal of NAND logic of the both as an output signal d.

The NAND element 714 receives the output c of the NAND element 711 and the output d of the NAND element 713, and outputs a signal of NAND logic of the both as an output signal e.

Reference numeral 715 indicates an inverter element, which inverts the output of the NAND element 714, and outputs an output signal 900. Incidentally, this output signal 900 of the inverter element 715 corresponds to each one bit of the 8-bit bus, that is, each bit shown by reference numerals 901 to 908 in FIG. 5.

The operation of the data latches 701 to 708 shown in FIG. 7 is described below by reference to the timing chart in FIG. 8.

As the outline of the function, when the control signal 800 is of high level, the compensated communication data 50 is transmitted intact to the output 900, and when the control signal 800 is of low level, value of the compensated communication data 50 having been stored at that time is outputted as the output 900. A specific description follows.

At first, in case of the control signal 800 at high level and the compensated communication data 50 at low level, the output signal a of the inverter element 710 becomes high level, the output signal b of the NAND element 712 becomes high level, and the output signal c of the NAND element 711 becomes low level. As a result, the output signal e of the NAND element 714 becomes high level, and the output signal 900 of the inverter element 715 becomes low level.

Figure 8:
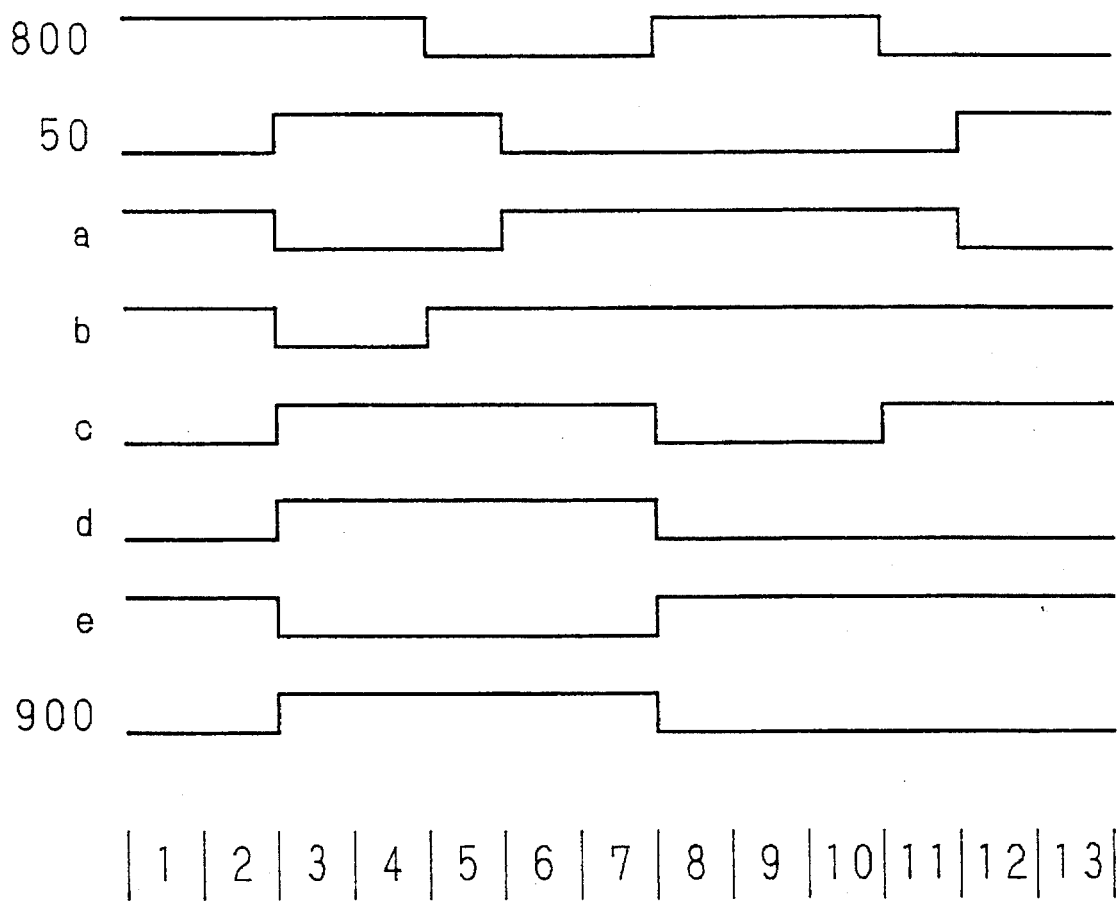
FIG. 8 is a timing chart showing an operation example of the data latch shown in FIG. 7.

This state is shown in the first and second, and eighth to tenth cycles at the left end in FIG. 8.

In this state, when the compensated communication data 50 becomes high level, the output signal a of the inverter element 710 becomes low level, the output signal b of the NAND element 712 becomes low level, and the output signal c of the NAND element 711 becomes high level. As a result, since the output signal d of the NAND element 713 becomes high level and the output signal e of the NAND element 714 becomes low level, the output signal 900 of the inverter element 715 becomes high level.

This state is shown in the third and fourth cycles in FIG. 8.

Herein, when the control signal 800 becomes low level, the output signal b of the NAND element 712 and the output signal c of the NAND element 711 are both kept at high level. Thereby, the output signal d of the NAND element 713 and the output signal e of the NAND element 714 do not depend on changing of the compensated communication data 50 and are hence unchanged, and the output signal 900 of the inverter element 715 is kept at high level. Therefore, the data latches shown in FIG. 7 are in the state of storing the high level signals.

This state is shown in the fifth to seventh cycles in FIG. 8.

The operation for storing the low level is similarly shown in the eighth to thirteenth cycles in FIG. 8.

A configuration example of the control signal generating circuit 10 is described below while referring to a block diagram in FIG. 9.

Figure 9:
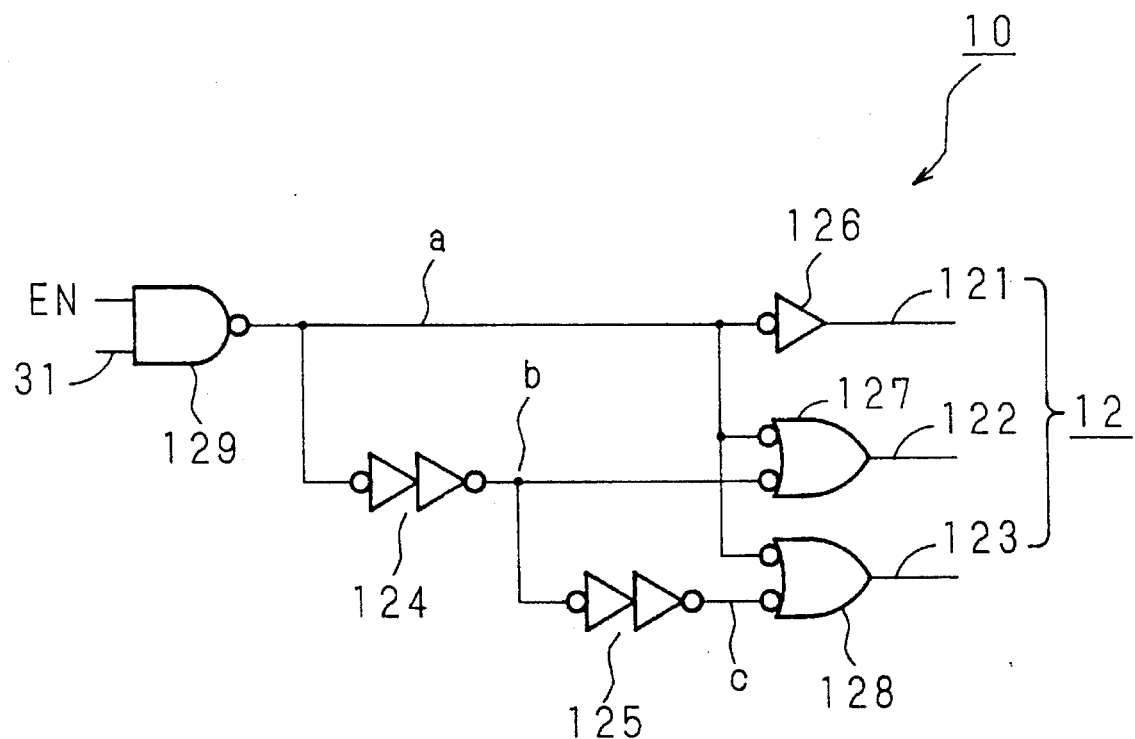
FIG. 9 is a logic circuit diagram showing a configuration example of a control signal generating circuit of the first embodiment of the invention.

In FIG. 9, reference numeral 129 is a NAND element, which receives an enable signal for controlling the operation of the control signal generating circuit 10 and a communication clock 31 (an inverted signal of communication clock 3), and outputs a signal of NAND logic of the both as an output signal a. In addition, the enable signal is assuming that it is always asserted.

Reference numeral 124 denotes a delay element, which is composed of plural inverter elements for delaying the transmission of the output signal a of the NAND element 129. The output signal of this delay element 124 is b.

Reference numeral 125 is also a delay element, which is composed of plural inverter elements for delaying the transmission of the output signal b of the delay element 124. The output of this delay element 125 is c.

Reference numeral 126 denotes an inverter element, which inverts the output signal a of the NAND element 129, and outputs as a first control signal 121.

Reference numeral 127 is a NAND element, which receives the output signal a of the NAND element 129 and output signal b of the delay element 124, and outputs a signal of NAND logic of the both as a second control signal 122.

Reference numeral 128 is also a NAND element, which receives the output signal a of the NAND element 129 and output signal c of the delay element 125, and outputs a signal of NAND logic of the both as a third control signal 123.

The operation of thus configured control signal generating circuit 10 is described below while referring to the timing chart in FIG. 10.

At first, when the enable signal is at low level, the output signal a of the NAND element 129 is always at high level not depending on the communication clock 31. Accordingly, the three control signals 121 to 123 are always at low level.

Figure 10:
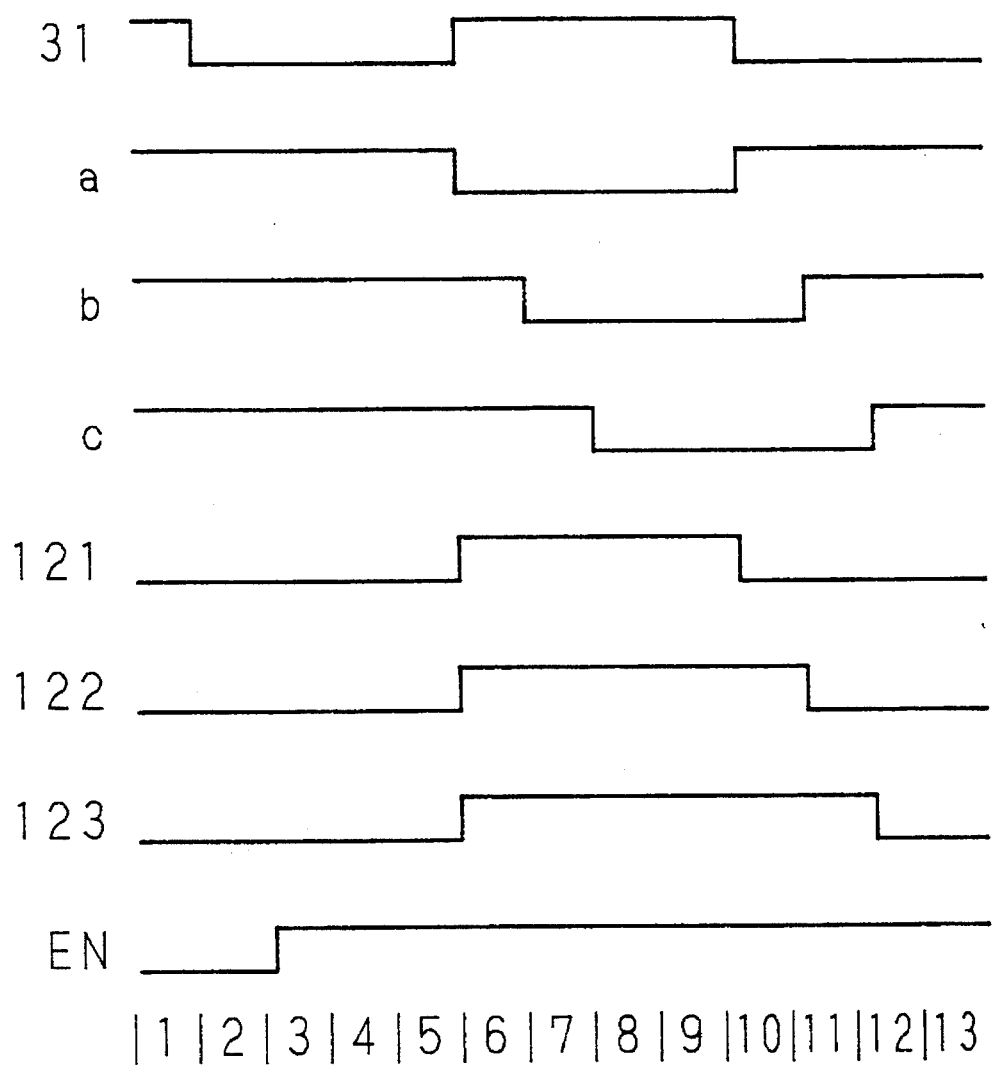
FIG. 10 is a timing chart showing an operation example of the control signal generating circuit shown in FIG. 9.

This state is shown in the first and second cycles at the left end in FIG. 10.

When the enable signal becomes high level, the output signal a of the NAND element 129 depends on the communication clock 31, and when the communication clock 31 becomes high level, the output signal a of the NAND element 129 becomes low level, while the three control signals 121 to 123 become high level. However, the output signals b, c of the delay elements 124, 125 still remain at high level.

This state is shown in sixth cycle in FIG. 10.

Next, the output signals b, c of the delay elements 124, 125 are changed to low level, but since the communication clock 31 remains at high level, the three control signals 121 to 123 are unchanged and remain at high level.

This state is indicated in seventh and ninth cycles in FIG. 10.

When the communication clock 31 becomes low level, the output signal a of the NAND element 129 becomes high level, and the first control signal 121 which is the output signal of the inverter 126 becomes low level. However, both the output signals b, c of the two delay elements 124, 125 remain at low level, and hence the remaining two control signals 122, 123 remain at high level. When the level of the output signal a of the NAND element 129 is transmitted to the output signal b of the delay element 124, the second control signal 122 which is the output signal of the NAND element 127 becomes low level. Finally, when the level of the output signal b of the delay element 124 is transmitted to the output signal c of the delay element 125, the final control signal 123 which is the output signal of the NAND element 128 also becomes low level.

This state is indicated as transition of signal as in tenth to twelfth cycles in FIG. 10.

A configuration example of communication data compensation circuit 11 is explained by reference to a block diagram in FIG. 11.

Figure 11:
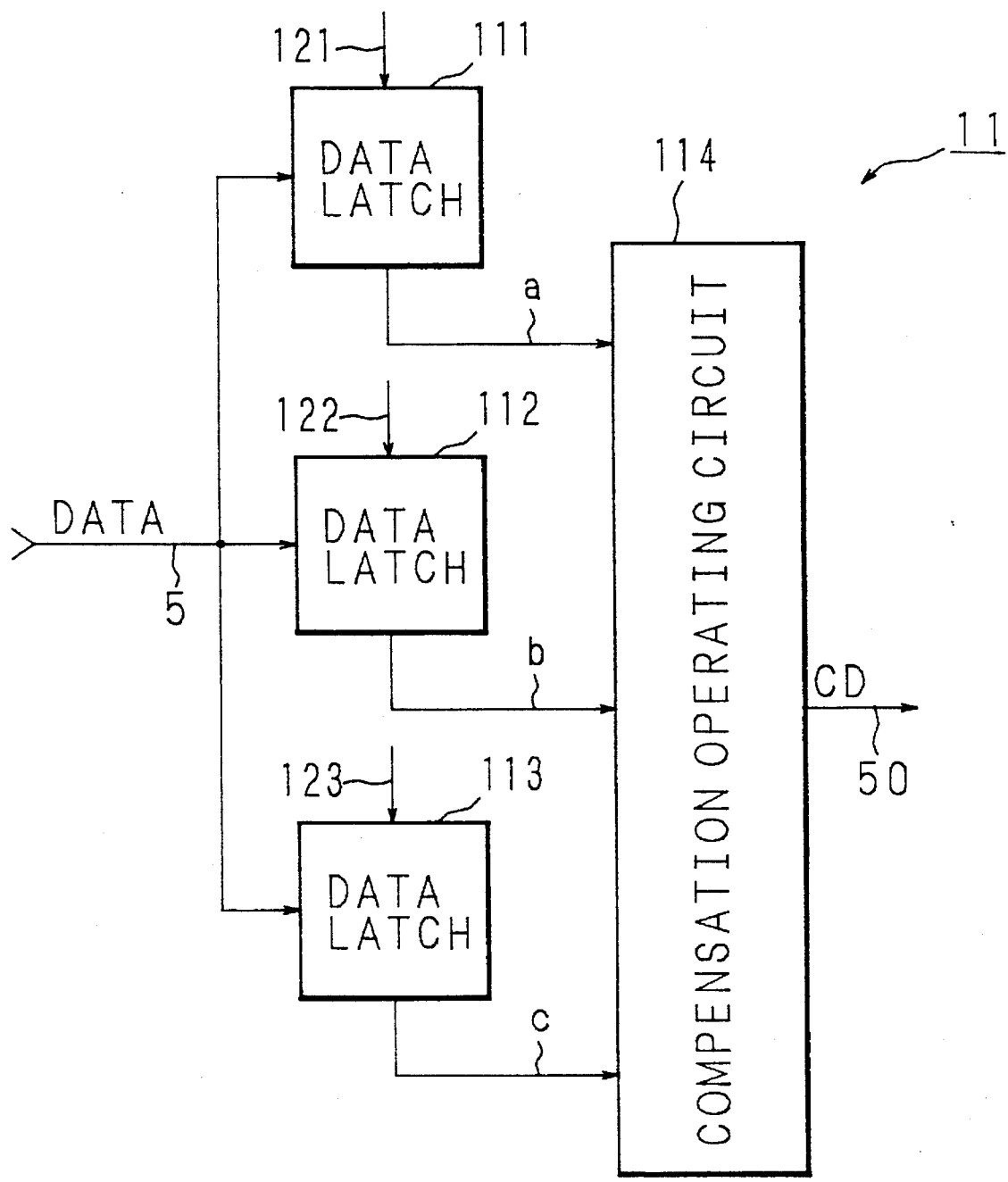
FIG. 11 is a block diagram showing a configuration example of a communication data compensating circuit of the first embodiment of the invention.

In FIG. 11, reference numeral 111 denotes a data latch for receiving communication data 5, to which a first control signal 121 generated by the control signal generating circuit 10 is given as a control signal.

Reference numeral 112 denotes a data latch for receiving communication data 5, to which a second control signal 122 generated by the control signal generating circuit 10 is given as a control signal.

Reference numeral 113 denotes a data latch for receiving communication data 5, to which a third con rol signal 123 generated by the control signal generating circuit 10 is given as a control signal.

The specific configuration of the data latches 111, 112, and 113 is same as that of the data latches shown in FIG. 7, and hence its description is omitted.

Reference numeral 114 represents a compensation operation circuit, which receives the output signal a of the data latch 111, output signal b of the data latch 112, and output signal c of the data latch 113, and outputs compensated communication data 50.

Figure 12:
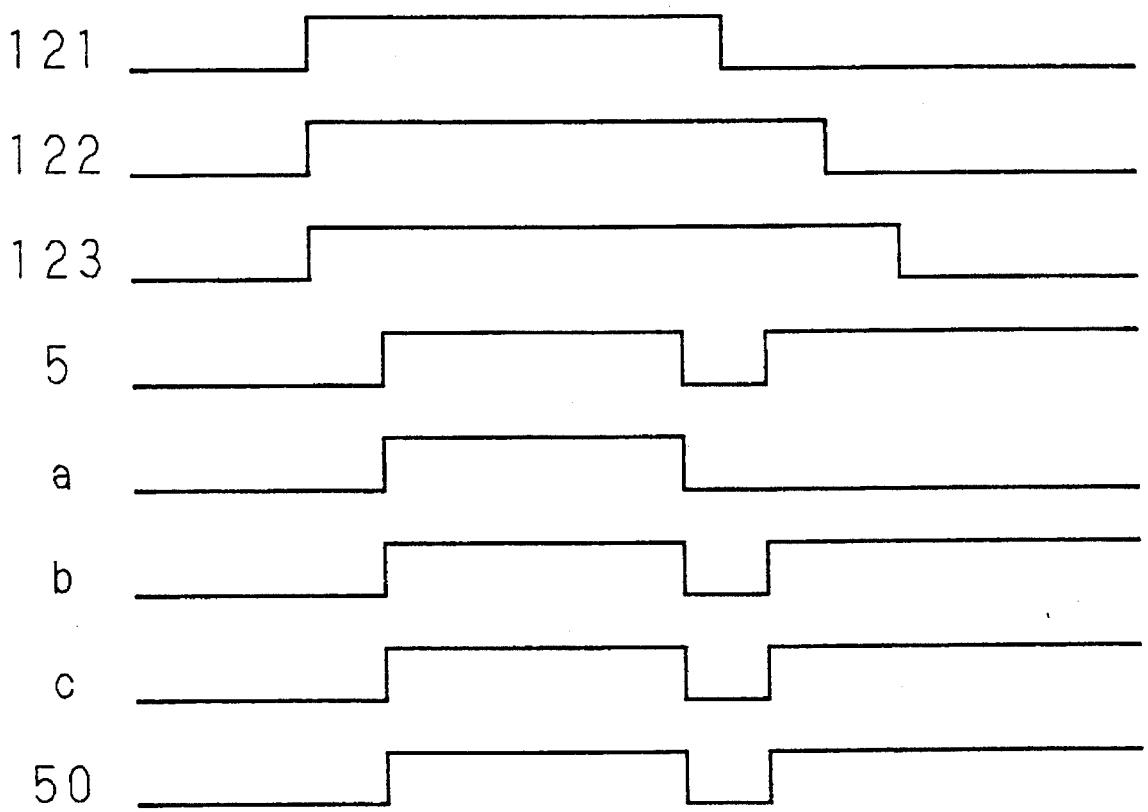
FIG. 12 is a timing chart showing an operation example of the communication data compensating circuit shown in FIG. 11.

The operation of thus configured communication data compensation circuit 11 is explained below while referring to the timing chart in FIG. 12.

The control signals 121 to 123 are simultaneously turned to high level in synchronism with the communication clock 3, and at this timing the data latches 111 to 113 take in the communication data 5. However, the data storing timing of each one of the data latches 111 to 113 is the timing of changing to low level of the control signals 121 to 123.

Therefore, the communication data 5 is assumed to be changed from high level to low level due to influence of noise just before the first control circuit 121 becomes low level., the data latch 111 stores the low level, by mistake, instead of the high level. When, consequently, the communication data 5 is restored as the noise influence is eliminated before the second control signal 122 becomes low level, the data latch 112 stores the high level. As a result, the third control signal 123 becomes low level, and the data latch 113 stores the high level.

In this way, when "1" is received as communication data 5, the stored contents of the three data latches 111 to 113 are <011>. Accordingly, the compensation operation circuit 114 outputs "1"=<@011>, that is, sends the high level signal to the compensated communication data 50.

Figure 13:
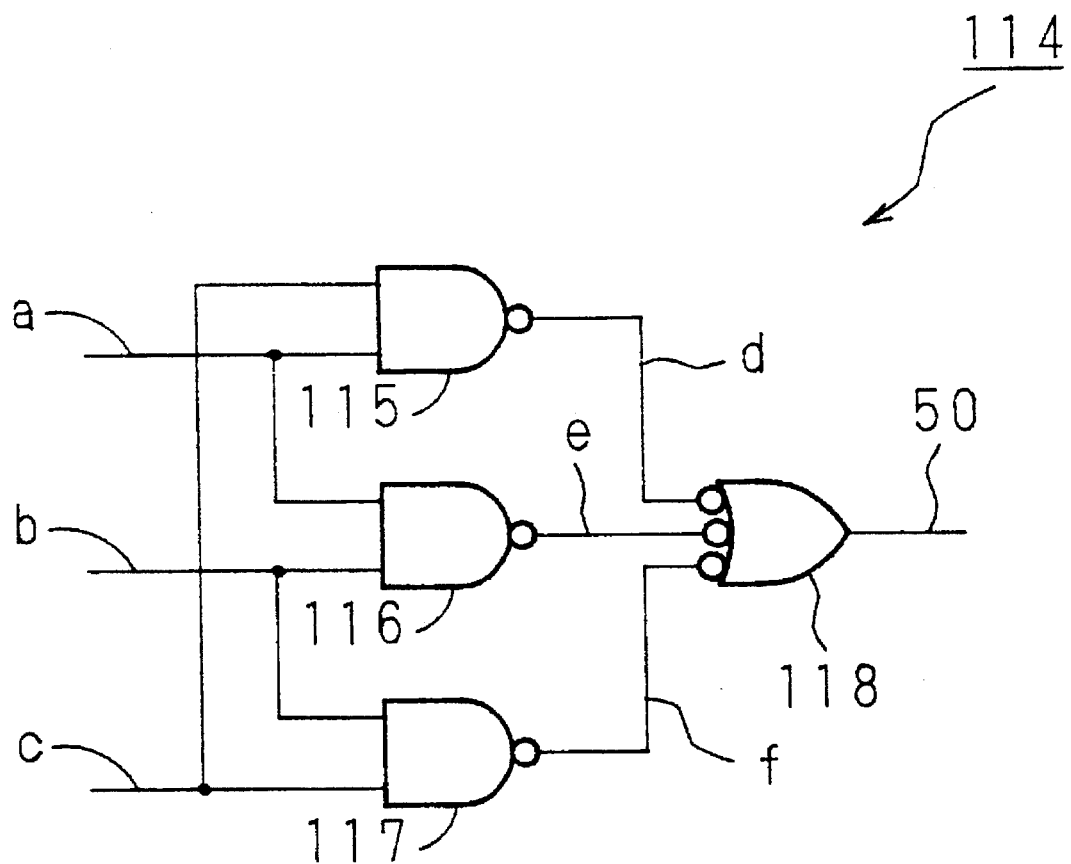
FIG. 13 is a logic circuit diagram showing a configuration example of a compensation operation circuit of the communication data compensating circuit of the first embodiment of the invention.

A configuration example of compensation operation circuit 114 is explained in FIG. 13.

In FIG. 13, reference numeral 115 is a NAND element, which receives the output signal a of the data latch 111 and the output signal c of the data latch 113, and outputs a signal of NAND logic of the both as an output signal d.

Reference numeral 116 is a NAND element, which receives the output signal b of the data latch 112 and the output signal a of the data latch 111, and outputs a signal of NAND logic of the both as an output signal e.

Reference numeral 117 is a NAND element, which receives the output signal c of the data latch 113 and the output signal b of the data latch 112, and outputs a signal of NAND logic of the both as an output signal f.

Reference numeral 118 is a NAND element, which receives the output signal d of the NAND element 115, the output signal e of the NAND element 116, and the output signal f of the NAND element 117, and outputs a signal of NAND logic of the three as compensated communication data 50.

The truth table of the compensation operation circuit 114 shown in FIG. 13, that is, the relation of three input signals a, b, c, three output signals d, e, f of the NAND elements 115, 116, 117, and compensated communication data 50 which is the output signal of the NAND element 118 is shown in FIG. 14.

In the truth table in FIG. 14, "L" denotes a low level signal, and "H" denotes a high level signal. As clear from this truth table, the compensation operation circuit 114 is a majority decision circuit for selecting two or as more identical values from three choices as its output, or the compensated communication data 50. However, the configuration of the communication data compensation circuit 11 is not limited to the description above, but, for example, the number of data latches may be increased, and it may be designed to compensate by judging the weighted mean of the values.

[Second Embodiment]

Second embodiment of the receiving unit 2 of the clocked serial I/O of the invention is described below with reference to drawings.

Figure 15:
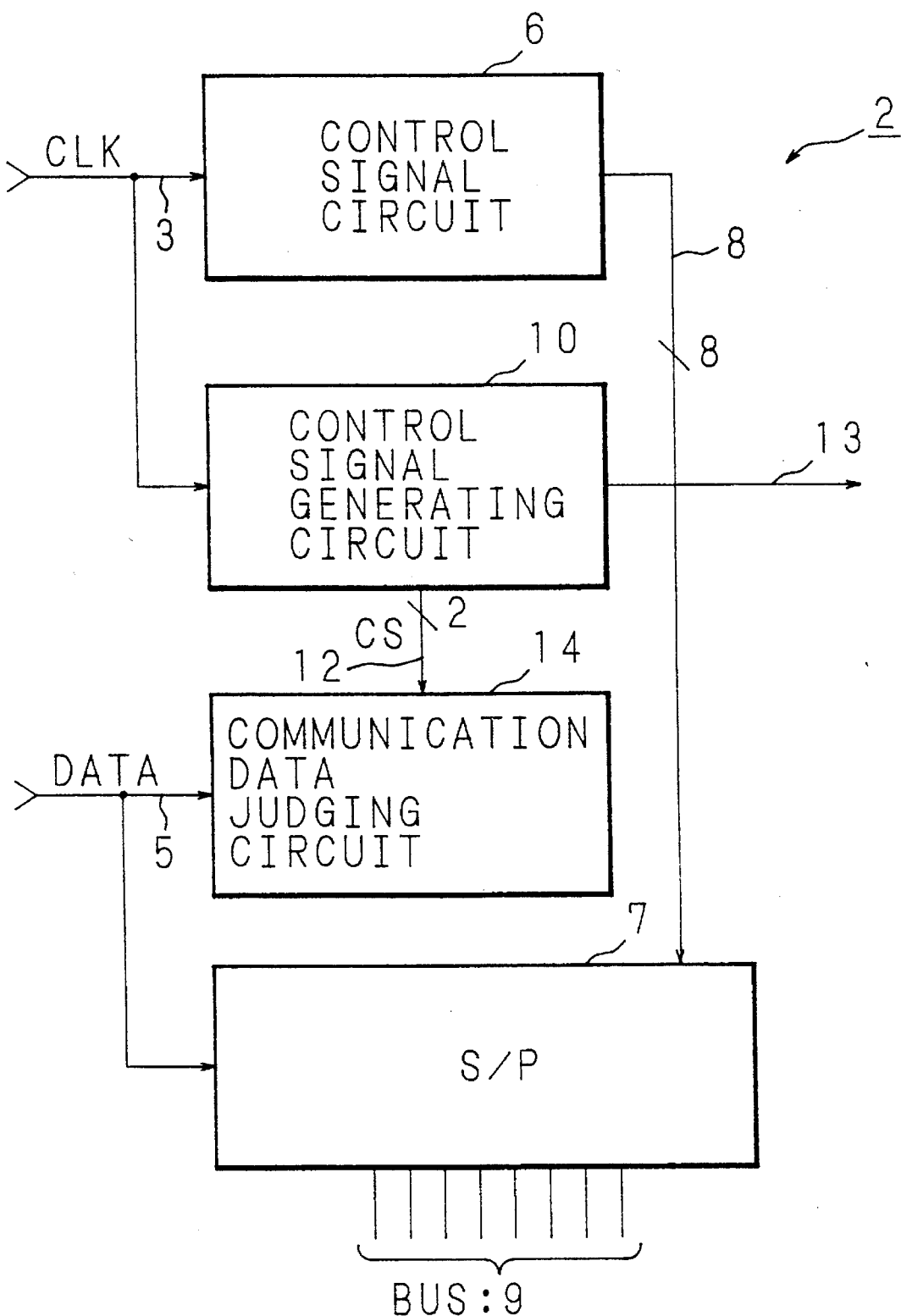
FIG. 15 is a block diagram showing a configuration example of a second embodiment of a receiving unit of a serial clocked I/O of the invention.

FIG. 15 is a block diagram showing a configuration example of the receiving unit 2 of the clocked serial I/O in the second embodiment.

In FIG. 15, same as in the first embodiment shown in FIG. 4, reference numeral 3 denotes a communication clock, 5 communication data, 6 a control signal circuit, 7 a serial/parallel converting circuit, 8 a control signal outputted by the control signal circuit 6, 9 a data bus, 10 a control signal generating circuit, and 12 denotes a control signal outputted by the control signal generating circuit 10.

In second embodiment, however, only two control signals 12 are outputted from the control signal generating circuit 10.

In this embodiment, instead of the communication data compensation circuit 11 provided in the abovementioned first embodiment, communication data judging circuit shown by reference numeral 14 is provided. To this communication data judging circuit 14, the control signal 12 outputted from the control signal generating circuit 10 is given instead of the serial/parallel converting circuit 7 of the first embodiment, and communication data 5 is also given.

The communication data judging circuit 144 temporarily stores the communication data 5 in accordance with two control signals 12 outputted by the control signal generating circuit 10, and judges the validity of the information of the communication data 5 according to the content, and sends a communication abnormal signal 13 of high level as required.

The operation of second embodiment of thus composed receiving unit 2 of the clocked serial I/O of the invention is described below.

For example, when data "b00110110" is received is described. In this case, since the control signal generating circuit 10 generates two kinds of control signals 12 which rise simultaneously at the falling timing of the communication clock 3 and fall respectively at different timing from each other, the first data "0" sent forth as communication data 5 is stored by the communication data judging circuit 14 as "0" at the first falling timing of the control signal 12, and as "0" at the second falling timing respectively. Since two stored results are both "0", the communication data judging circuit 14 judges that the first data of the communication data 5 is correct at "0".

Next, the serial/parallel converting circuit 7 temporarily stores the communication data 5 by taking into the control signal 8 outputted from the control signal circuit 6.

Thus, the second and third data "0", "1" are taken in sequentially. When the fourth data "1" is taken in, suppose noise is assumed to be generated in the communication data 5 at the sampling timing. In this case, since the noise timing was the rising timing of the communication clock 3, the communication data judging circuit 14 stores <01>. In this case, since the two stored contents are different from each other, the communication data judging circuit 14 judges that the data was abnormal, and sends out a communication data abnormal signal 13 of high level.

In this way, in the second embodiment, when the communication data judging circuit 14 judges that the received data was abnormal, the communication data abnormal signal 13 of high level is outputted, and therefore by interrupt processing according to this communication data abnormal signal 13, the countermeasure can be taken, for example, the transmit unit 1 of the clocked serial I/O is requested to retransmit the data. It prevents transmission and reception of wrong data due to noise of the communication data 5.

Figure 16:
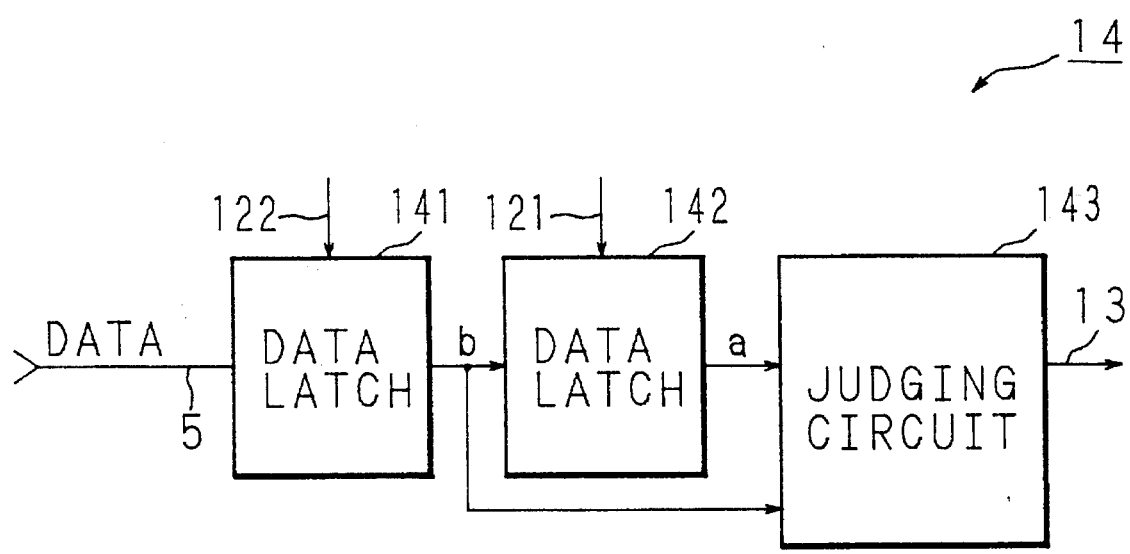
FIG. 16 is a block diagram showing a configuration example of a communication data judging circuit of the second embodiment of the invention.

Of the configuration example of second embodiment shown in FIG. 15, the detail is described about the communication data judging circuit 14 provided instead of the communication data compensation circuit 11 in the first embodiment, by reference to a block diagram of FIG. 16.

In FIG. 16, reference numeral 141 is a data latch which receives the communication data 5, and is provided with a second control signal 122 as control signal.

Reference numeral 142 is a data latch which receives the output signal b of the data latch 141, and is provided with a first control signal 121 as control signal.

The both data latches 141, 142 are same as the data latches shown in FIG. 7 in configuration, and the detail is omitted.

Reference numeral 143 is a judging circuit, which receives output signal b of the data latch 141 and the output signal a of the data latch 142, and judges whether the both stored contents agree or not. When the result of judgment by the judging circuit 143 is disagreement, the judging circuit 143 outputs a communication data abnormal signal 13 of high level as output signal.

Figure 17:
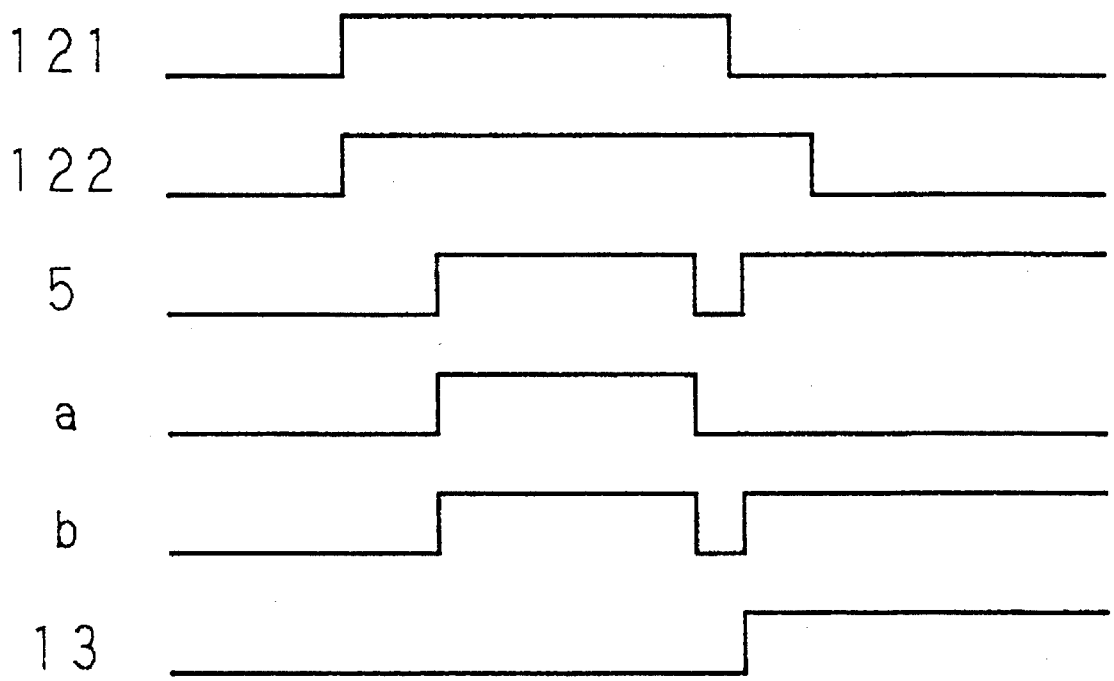
FIG. 17 is a timing chart showing an operation example of the communication data judging circuit shown in FIG. 17.

The operation of the communication data judging circuit 14 is explained below while referring to the timing chart in FIG. 17.

The control signals 121, 122 become high level simultaneously in synchronism with the falling of the communication clock 3, and the data latches 141, 142 take in the communication data 5 at that timing. In both data latches 141, 142, however, the data storing timing is the falling timing from high level to low level of the control signals 121, 122.

Accordingly, for example, the communication data 5 is assumed to be changed from high level to low level due to influence of noise just before the first control signal 121 becomes low level, the data latch 142 stores the low level, by mistake, instead of the high level. Next, when the communication data 5 is restored as the noise influence is eliminated before the second control signal 122 becomes low level, the data latch 141 stores the high level.

Finally, the contents stored by the two data latches 141, 142 are <01>. According to this result, the judging circuit 143 judges that the stored contents does not agree, and a communication data abnormal signal 13 of high level is outputted.

Figure 18:
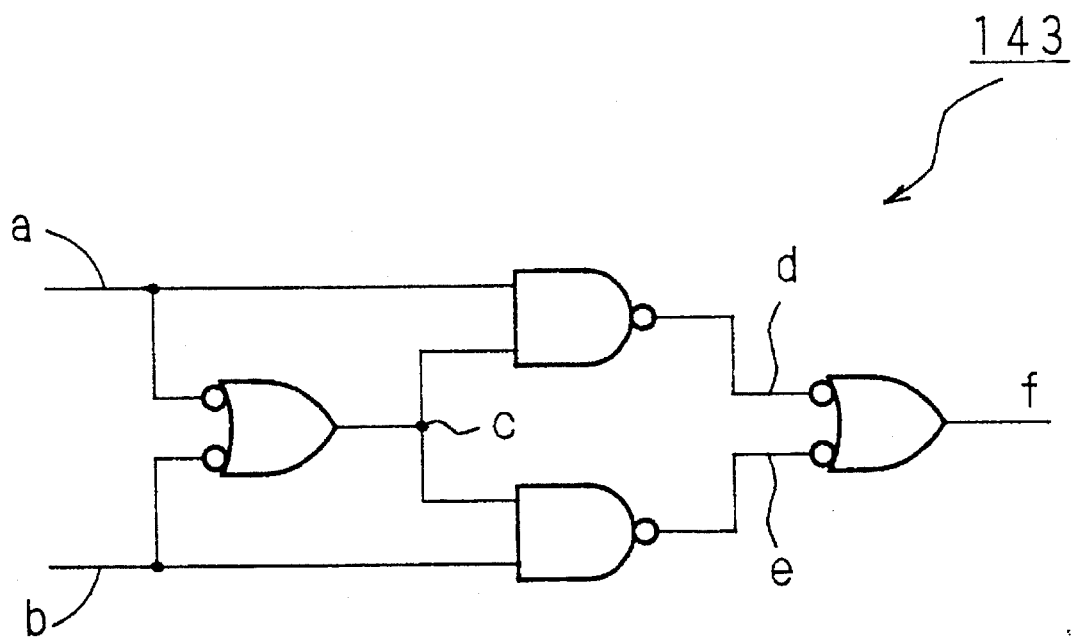
FIG. 18 is a logic circuit diagram showing a configuration example of a judging circuit of the communication judging circuit of the second embodiment of the invention.

A configuration example of the judging circuit 143 is shown in a logic circuit diagram in FIG. 18.

Figure 19:
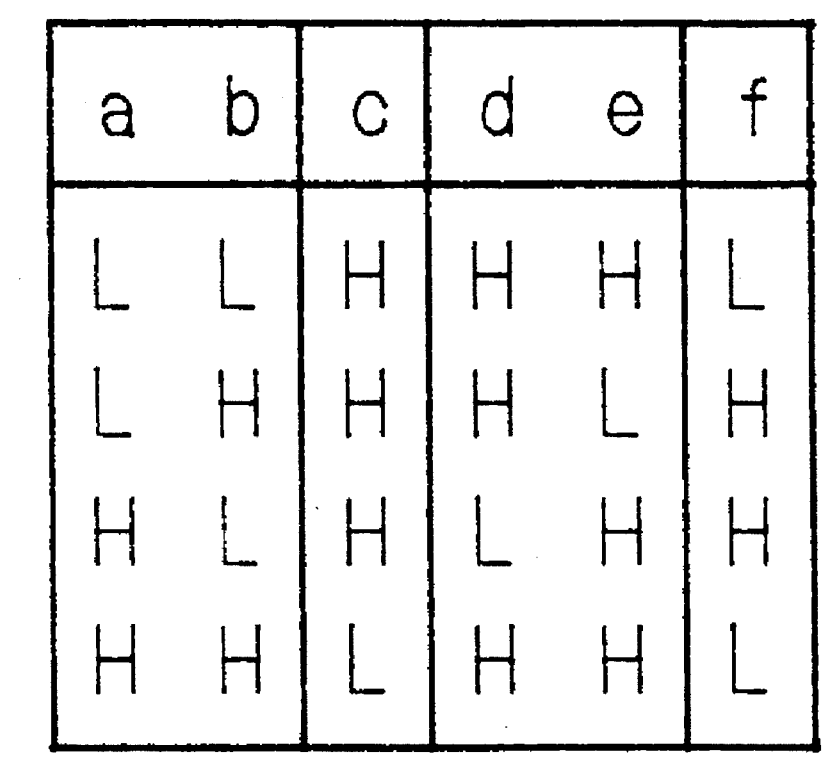

The judging circuit 143 realizes the logic as shown in the truth table in FIG. 19 by connecting four NAND elements as shown in the diagram. As a result, only when the two input signals a and b are different from each other, the output signal f, that is, the communication data abnormal signal 13 becomes high level.

[Third Embodiment]

Third embodiment of the receiving unit 2 of the clocked serial I/O of the invention is described below by referring to drawings.

Figure 20:
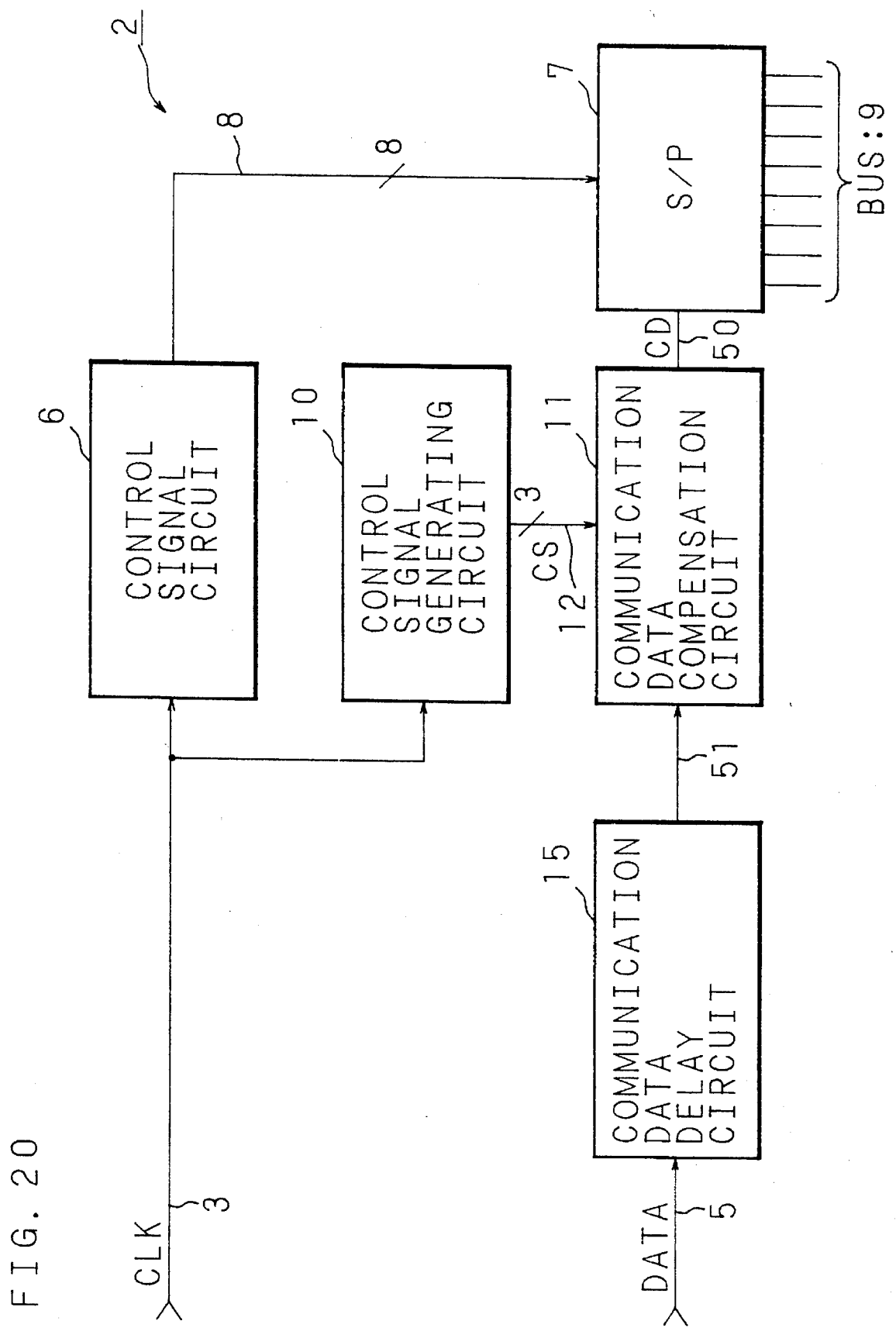
FIG. 20 is a block diagram showing a configuration example of a third embodiment of a receiving unit of a serial clocked I/O of the invention.

FIG. 20 is a block diagram showing a configuration example of the receiving unit 2 of the clocked serial I/O in third embodiment.

In FIG. 15, same as embodiment shown in FIG. 4, reference numeral 3 denotes a communication clock, 5 communication data, 6 a control signal circuit, 7 a serial/parallel converting circuit, 8 a control signal outputted by the control signal circuit 6, 9 a data bus, 10 a control signal generating circuit, 12 a control signal outputted by the control signal generating circuit 10, 11 a communication data compensation circuit, and 50 denotes compensated communication data.

In third embodiment, in addition to the configuration in the first embodiment, a communication data delay circuit indicated by reference numeral 15 is provided, and the communication data 15 is given to this communication data delay circuit 5, instead of the communication data compensation circuit 11. From the communication data delay circuit 15, the delayed communication data shown by reference numeral 51 is given to the communication data-compensation circuit 11.

The communication data delay circuit 15 is provided in order to adjust the delay time of the communication data 5. The delayed communication data 51 which is the output signal of the communication data delay circuit 15 is stored in the communication data compensation circuit 11 according to three control signals 12 generated by the control signal generating circuit 10.

The operation of thus configured third embodiment is described below.

For example, when data "b00110110" is received is described. In this case, since the control signal generating circuit 10 generates three kinds of control signals 12 which simultaneously rise at the falling timing of the communication clock 3 and fall respectively at different timing from each other, the first data "0" sent forth as communication data 5 is stored by the communication data compensation circuit 11 as "0" at the first falling timing of the control signal 12, as "0" at the second falling timing, and as "0" at the third falling timing respectively. Thus, all three stored results by the communication data compensation circuit 11 are "0", and the communication data compensation circuit 11 outputs "0"=<@000> as the compensated communication data 50.

The serial/parallel converting circuit 7 temporarily stores the compensated communication data 50 outputted from the communication data compensation circuit 11 by taking it into the control signal 8 outputted from the control signal circuit 6.

Thus, the second data and third data "0" and "1" are sequentially taken in. Then the fourth data "1" is taken in, and noise is assumed to be mixed in the communication data 5 at the sampling timing. In this case, since the noise timing is the rising timing of the communication clock 3, the data is delayed by the communication data delay circuit 15, and the communication data compensation circuit 11 stores <101>. However, when the communication data compensation circuit 11 performs compensation, it follows that "1"= <@101>, and hence "1" is outputted as the compensated communication data 50.

Consequently, the serial/parallel converting circuit 7 takes in "1" outputted as compensated communication data 50 by the communication data compensation circuit 11 according to the control signal 8. The remaining data are also taken into the serial/parallel converting circuit 7, and finally "b00110110" is outputted from the serial/parallel converting circuit 7 into the 8-bit bus 9.

In this way, the receiving unit 2 of the clocked serial I/O in the third embodiment receives correct data, when wrong data is received as noise is generated on the communication data 5, by compensating it.

The deviation of timing of the communication data 5 by the communication data delay circuit 15 is explained below by referring to the timing chart showing the relation between the communication clock of the receiving unit 2 of the clocked serial I/O and the timing of storing the communication data 5 in the communication data compensation circuit 11 in third embodiment shown in FIG. 20.

Figure 21:
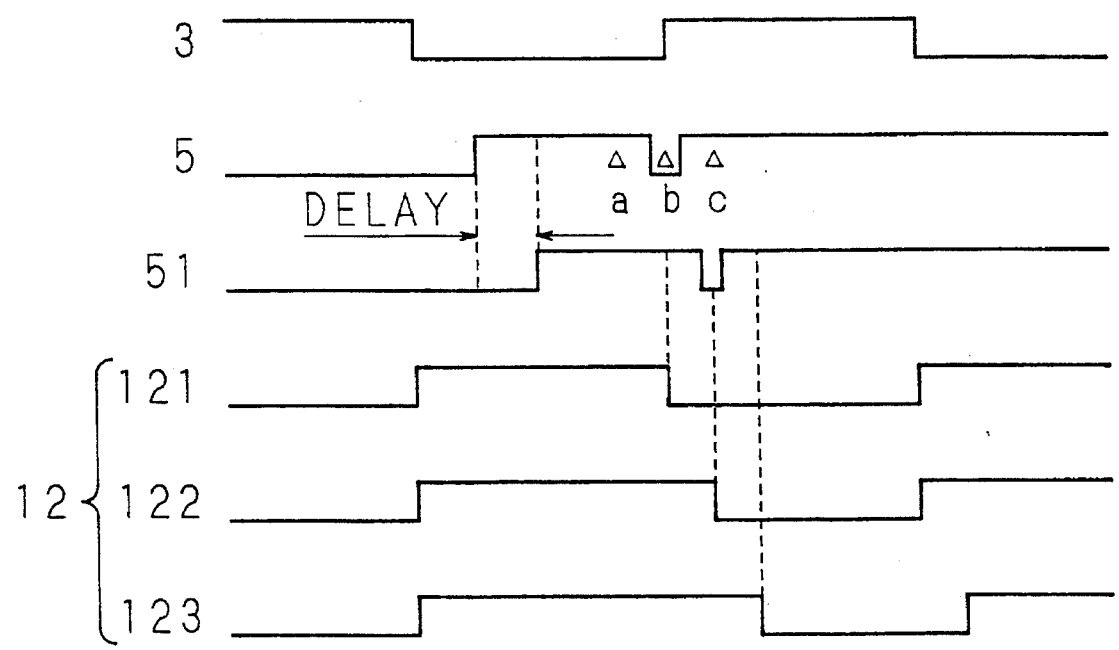
FIG. 21 is a timing chart showing an operation example of the third embodiment of the invention.

In FIG. 21, reference numeral 51 shows a waveform of delayed communication data of the output of the communication data delay circuit 15, 121 is a waveform of control signal of the earliest falling of the control signal generating circuit 10, 122 is a waveform of control signal of the second earlier falling of the control signal generating circuit 10, and 123 is a wave form of control signal of the final falling of the control signal generating circuit 10.

The content stored as the compensated communication data 50 is the value of the delayed communication data 51 which is the output of the communication data delay circuit 15, sampled at the falling timing of the three control signals 121 to 122 generated by the control signal generating circuit 10, it is deviated ahead in timing as compared with the communication data 5.

The position indicated by reference code a in FIG. 21 is sampled at the falling timing of the first control signal 121, the position of b is sampled at the falling timing of the second control signal 122, and the position of c is sampled at the falling timing of the third control signal 123. Accordingly, set up/hold time is enough ensured.

[Fourth Embodiment]

Fourth embodiment of the receiving unit 2 of the clocked serial I/O of the invention is described below.

Figure 22:
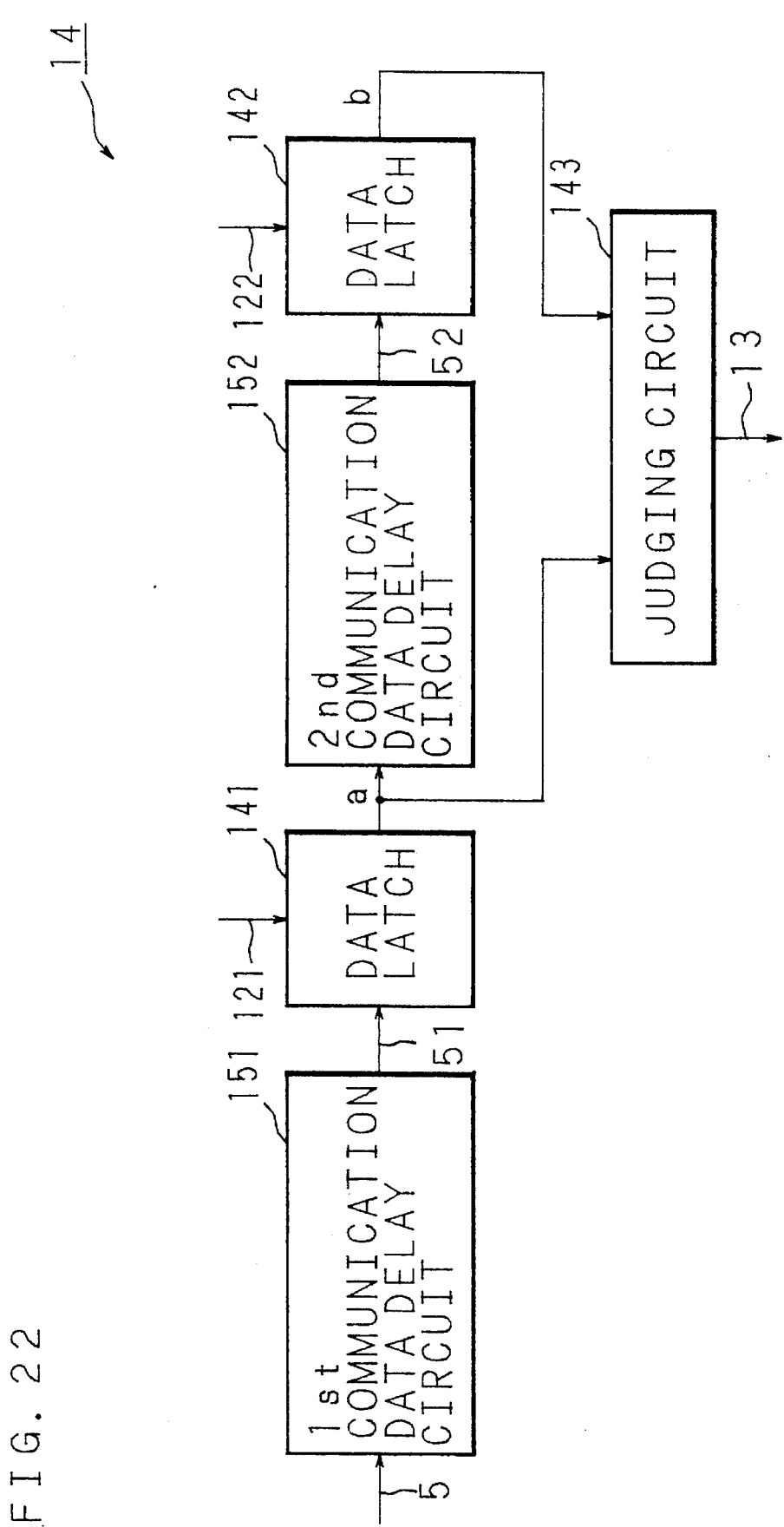
FIG. 22 is a block diagram showing a configuration example of a judging circuit of the fourth embodiment of a receiving unit of serial clocked I/O of the invention.

FIG. 22 is a block diagram showing a configuration example of essential parts of the receiving unit 2 of the clocked serial I/O in third embodiment.

In FIG. 22, a communication data delay circuit is inserted in the communication data judging circuit 14 of he receiving unit 2 of the clocked serial I/O of third embodiment explained in FIG. 15.

In FIG. 22, reference numeral 151 denotes a first communication data delay circuit which receives communication data 5 as input signal. Delayed communication data 51 which is an output; signal of this first delay circuit 151 is fed into a data latch indicated by reference numeral 141. To the data latch 141, the first control signal 121 is given as control signal. The configuration of the data latch 141 is same as the data latch shown in FIG. 7.

Reference numeral 152 denotes a second communication data delay circuit which receives the output signal a of the data latch 141 as an input signal. Delayed communication data 52 which is an output signal of this second communication delay circuit 152 is fed into a data latch indicated by reference numeral 142. To the data latch 142, the second control signal 122 is given as control signal. The configuration of the data latch 142 is same as the data latch shown in FIG. 7.

Reference numeral 143 demotes a judging circuit, which receives the output signal a of the data latch 141 and the output signal b of the data latch 142, and judges whether the two stored contents coincide or not. When the result of judgment is an agreement, the judging circuit 143 outputs a communication data abnormal signal 13 of high level as output signal.

The operation of fourth embodiment is described below.

For the simplicity of description, the delay of the first communication data delay circuit 151 is assumed to be zero, hence, the delayed communication data 51 which is its output signal varies at the same timing as the communication data 5, and the control signals 121, 122 are assumed to operate at the same timing.

Since the control signals 121, 122 are turned to high level at the same time, the data latches 141, 142 take in the communication data 5 at the same timing. However, the timing of the both data latches 141, 142 for storing the data is deviated due to delay by the second communication data delay circuit 152, and therefore the data latch 142 stores the prior data when compared with the data latch 141 in the viewpoint of time.

Figure 23:
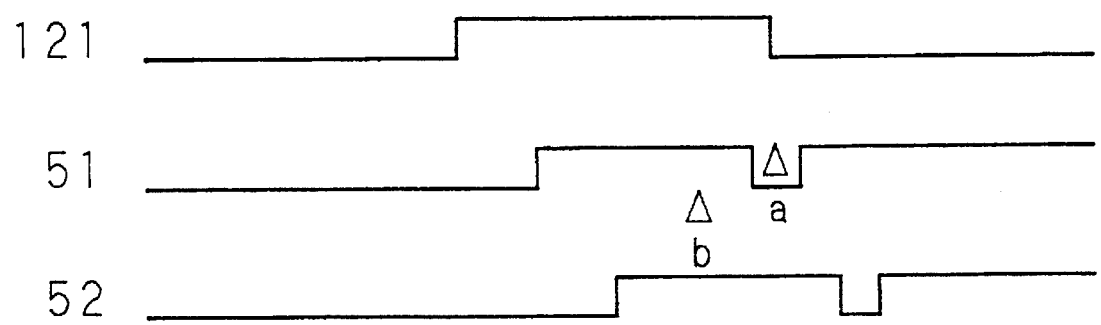
FIG. 23 is as timing chart showing an operation example of the judging circuit shown in FIG. 22.

In the timing chart in FIG. 23, the storing timing of the data latch 141 is indicated by reference code a, and the storing timing of the data latch 142 by reference code b.

Just before the first control signal 121 becomes low level, the communication data 5 is assumed to be changed from high level to low level due to influence of noise. Accordingly, the data latch 141 stores the low level, by mistake, instead of the high level. Before the second control signal 122 becomes low level, the noise of the communication data 5 is not transmitted yet, and therefore the data latch 142 stores the high level.

Finally, the contents stored by the two data latches 141, 142 are <01>. On the basis of this, the judging circuit 143 judges that the stored contents of the both data latches 141, 142 does not agree, and hence a communication data abnormal signal 13 of high level is outputted.

Thus, according to fourth embodiment, the same effects as in second embodiment are realized, and moreover, by setting the delay time in the first communication data delay circuit 151 and setting the delay time also in the both control signals 121, 122, the content of the communication data can be judged at various timings.

As described herein, in the receiving unit 2 of the clocked serial I/O, that is, the clock synchronous serial information receiving apparatus of the invention, when noise is generated on the communication data, it is converted into correct data by the communication data compensation circuit, and also by recognizing abnormality by the judging circuit or by instructing to transmit or receive again, data can be transmitted and received correctly.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A clock synchronous serial information receiving apparatus for receiving an information signal in synchronism with a clock, comprising:

control signal generating means for generating at least a first control signal and a second control signal commonly transitioning from a second state to a first state in synchronism with said clock;

information compensating means for storing values of said information respectively at the timings of transition of said at least first and second control signals from the first state to the second state, and for outputting, when the stored values agree with each other, the concurring stored values agree with each other, the concurring stored value, or when the store values do not agree with each other, one of the stored values according to a predetermined logic; and serial/parallel converting means for converting the values outputted serially from said information compensating means into a parallel output signal;

wherein said control signal generating means has signal generating means for varying the respective timings of transition of said at least first and second control signals from the first state to the second state.

2. A clock synchronous serial information receiving apparatus for receiving an information signal in synchronism with a clock, comprising:

control signal generating means for generating first, second, and third control signals commonly transitioning from a second state to a first state in synchronism with said clock;

information compensating means: having;
first storing means for storing the values of said information signal at the timing of said first control signal transitioning from the state to the second state;
second storing means for storing the values of said information signal at the timing of said second control signal transitioning from the first state to the second state;
third storing means for storing the values of said information signal at the timing of said third control signal transitioning from the first state to the second state; and
logical operating means for outputting, when the stored values of said first, second and third storing means agree with each other, the concurring stored value, or when the stored values of said first, second and third storing means do not agree with each other, the stored value determined to be in the majority; and serial/parallel converting means for converting the value outputted serially from said logical operating means into a parallel output signal;

wherein said control signal generating means has signal generating means for varying the timing of transition of said first control signal from the first state to the second state, the timing of transition of said second control signal from the first state to the second state, and the timing of transition of said third control signal from the first state to the second state.

3. A clock synchronous serial information receiving apparatus for receiving an information signal in synchronism with a clock, comprising:

control signal generating means for generating at least a first control signal and a second control signal commonly transitioning from a second state to a first state in synchronism with said clock;

information judging means for storing values of said information signal respectively at the timing of transition of said first control signal from the first state to the second state and at the timing of transition of said second control signal from the first state to the second state, and for judging whether the both stored values agree or not; and serial/parallel converting means for converting the value of said information signal inputted serially into a parallel output signal;

wherein said control signal generating means has signal generating means for varying the timing of transition of said first control signal from the first state to the second state and the timing of transition of said second control signal from the first state to the second state.

4. A clock synchronous serial information receiving apparatus for receiving an information signal in synchronism with a clock, comprising:

control signal generating means for generating a first control signal and a second control signal commonly transitioning from a second state to a first state in synchronism with said clock;

information judging means: having;
first storing means for receiving said information signal, and outputting said information signal when said second control signal is in the first state, for storing the value of said information signal at the timing of transition of said second control signal from the first state to the second state, and for outputting the stored value when said second control signal is in the second state;
second storing means for receiving the output signal of said first storing means, and storing the value of the output signal of said first storing means at said timing of the transition of said first control signal from the first state to the second state; and
logical operating means for judging whether said stored values of said first and second storing means agree with each other or note, and for outputting a predetermined signal when the stored values do not agree; and serial/parallel converting means for converting said value of said information signal outputted serially into a parallel output signal;

wherein said control signal generating means has signal generating means for varying the timing of transition of said first control signal from the first state to the second state and the timing of transition of said second control signal from the first state to the second state.

5. A clock synchronous serial information receiving apparatus for receiving an information signal in synchronism with a clock, comprising:

control signal generating means for generating at least a first control signal and a second control signal commonly transitioning from a second state to a first state in synchronism with said clock;

information compensating means for storing values of said information signal respectively at the timings of transition of said at least first and second control signals from the first state to the second state, and for outputting, when the stored values agree with each other, the concurring stored value, or when the stored values do not agree with each other, one of the stored values according to a predetermined logic;

serial/parallel converting means for converting the values outputted serially from said information compensating means into a parallel output signal; and delaying means for delaying the input of said information signal into said information compensating means;

wherein said control signal generating means has signal generating means for varying the respective timings of transition of said at least first and second control signals from the first state to the second state.

6. A clock synchronous serial information receiving apparatus for receiving an information signal in synchronism with a clock, comprising:

control signal generating means for generating first, second and third control signals individually transitioning from a second state to a first state in synchronism with said clock;

information compensating means: having;

first storing means for storing the values of said information signal at the timing of said first control signal transitioning from the first state to the second state;

second storing means for storing the values of said information signal at the timing of said second control signal transitioning from the first state to the second state;

third storing means for storing the values of said information signal at the timing of said third control signal transitioning from the first state to the second state; and logical operating means for outputting, when the stored values of said first, second and third storing means agree with each other, the concurring stored value, or when the stored values of said first, second and third storing means do not agree with each other, the stored value determined to be in the majority; and serial/parallel converting means for converting the value outputting serially from said logical operating means into a parallel output signal; and delaying means for delaying the input of said information signal into said information compensating means;

wherein said control signal generating means has signal generating means for varying the timing of transition of said first control signal from the first state to the second state, the timing of transition of said second control signal from the first state to the second state, and the timing of transition of said third control signal from the first state to the second state.

7. A clock synchronous serial information receiving apparatus for receiving an information signal in synchronism with a clock, comprising:

control signal generating means for generating at least a first control signal and a second control signal commonly transitioning from a second state to a first state in synchronism with said clock;

information judging means for storing the values of said information signal delayed by predetermined times and at the timing of transition of said first control signal from the first state to the state and at the timing of transition of said second control signal from the first state to the second state, and for judging whether the both stored values agree or not; and serial/parallel converting means for converting the value of said information signal inputted serially into a parallel output signal;

wherein said control signal generating means has signal generating means for varying the timing of transition of said first control signal from the first state to the second state and the timing of transition of said second control signal from the first state to the second state.

8. A clock synchronous serial information receiving apparatus for receiving an information signal in synchronism with a clock, comprising:

control signal generating means for generating a first control signal and a second control signal commonly transitioning from a second state to a first state in synchronism with said clock;

information judging means: having;

first storing means for receiving said information signal, and outputting said information signal when said second control signals in the first state, for storing the value of said information signal at the timing of transition of said second control signal from the first state to the second state, and for outputting the stored value when said second control signal is in the second state;

delaying means for delaying the output of said first storing means;

second storing means for receiving the output signal of said delaying means, and storing the value of the output signal of said delaying means at said timing of the transition of said first control signal form the first state to the second state; and logical operating means for judging whether said stored values of said first and second storing means agree with each other or not, and for outputting a predetermined signal when not agree; and serial/parallel converting means for converting said value of said information outputted serially into parallel and sending out;

wherein said control signal generating means has signal generating means for varying the timing of transition of said first control signal from the first state to the second state and the timing of transition of said second control signal from the first state to the second state.

* * * * *